US012772459B2

(12) United States Patent
Liao et al.

(10) Patent No.: US 12,772,459 B2
(45) Date of Patent: Oct. 20, 2026

(54) VERTICAL PHASE CHANGE MEMORY DEVICE AND RELATED METHOD

(71) Applicant: Taiwan Semiconductor Manufacturing Co., Ltd., Hsinchu (TW)

(72) Inventors: Shih-Yu Liao, Hsinchu (TW); Chung-Liang Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/438,117

(22) Filed: Feb. 9, 2024

(65) Prior Publication Data

US 2025/0261379 A1 Aug. 14, 2025

(51) Int. Cl.
*H10B 63/00* (2023.01)
*H10B 63/10* (2023.01)

(52) U.S. Cl.
CPC ............ *H10B 63/34* (2023.02); *H10B 63/10* (2023.02)

(58) Field of Classification Search
CPC ........ H10B 63/34; H10B 63/10; H10B 63/30; H10N 70/231; H10N 70/826; H10N 70/8828; H10N 70/8833
See application file for complete search history.

(56) References Cited

U.S. PATENT DOCUMENTS 9,236,267 B2 1/2016 De et al.
9,502,265 B1 11/2016 Jiang et al.
9,520,466 B2 12/2016 Holland et al.
9,520,482 B1 12/2016 Chang et al.
9,536,738 B2 1/2017 Huang et al.
9,576,814 B2 2/2017 Wu et al.
9,608,116 B2 3/2017 Ching et al.
9,786,774 B2 10/2017 Colinge et al.
9,853,101 B2 12/2017 Peng et al.
9,881,993 B2 1/2018 Ching et al.
2021/0399051 A1* 12/2021 Wu ........................ H10B 53/30
2022/0108997 A1 4/2022 Hekmatshoartabari et al.
2022/0367796 A1* 11/2022 Lin ........................ H10B 63/20
2023/0217663 A1 7/2023 Han et al.
2023/0284461 A1 9/2023 Wu et al.
2024/0015965 A1 1/2024 Choi et al.

FOREIGN PATENT DOCUMENTS

TW 200721387 A 6/2007
TW 200746483 A 12/2007
TW 200939466 A 9/2009
TW 202335247 A 9/2023
TW 202339191 A 10/2023
TW 202404050 A 1/2024

* cited by examiner

*Primary Examiner* — Leonardo Andujar
(74) *Attorney, Agent, or Firm* — Seed IP Law Group

(57) ABSTRACT

A device includes: a device layer; and an interconnect structure on the device layer, the interconnect structure including a phase change random access memory (PCRAM) device. The PCRAM device includes: an electrode layer above the device layer; an oxide semiconductor layer on the electrode layer; a gate structure that wraps around the oxide semiconductor layer; an insulating layer on the gate structure; and a phase change resistor. The phase change resistor includes: a bottom electrode on the oxide semiconductor layer; a phase change layer on the bottom electrode; and a top electrode on the phase change layer.

20 Claims, 20 Drawing Sheets

FIG. 5
1000
1010
Form device layer
1020
Form first portion of interconnect structure on device layer
1030
Form oxide semiconductor channel on first portion
1040
Form gate adjacent channel
1050
Form phase change fused device on channel
1060
Form spacers on phase change fused device
1070
Form WL, BL and ground contacts to gate, drain and fused device
1080
Form second portion of interconnect structure on contacts

FIG. 6
2000
Form device layer
2010
Form first portion of interconnect structure on device layer
2020
Form phase change fused device on first portion
2030
Form oxide semiconductor channel on fused device
2040
Form gate adjacent channel
2050
Form WL, BL and ground contacts to gate, drain and fused device
2060
Form second portion of interconnect structure on contacts
2070

VERTICAL PHASE CHANGE MEMORY DEVICE AND RELATED METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1C:
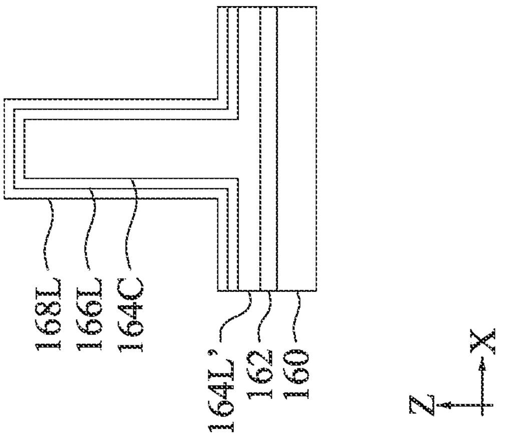
FIGS. 1A-1Q are views of various embodiments of an IC device at various stages of fabrication according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms.

The terms "first," "second," "third" and so on may be used herein to describe a sequence of events or sequential order of elements but may be exchanged or varied in some contexts. For example, a second layer may be formed on (e.g., sequentially after) a first layer, but in some contexts the first layer may be referred to as a "second layer," "third layer," "fourth layer" or the like, and the second layer may be referred to as a "first layer," "third layer," "fourth layer," or the like.

The term "surrounds" may be used herein to describe a structure that fully or partially encloses another element or structure, for example, in three dimensions. For example, a first structure may "surround" a second structure on four lateral sides (e.g., left, right, front and back) without surrounding the second structure on two vertical sides (e.g., top and bottom). In other example, the first structure may wrap partially around the second structure, for example, by wrapping around three sides (e.g., top, front and back) while leaving other sides (e.g., left, right and bottom) exposed.

The present disclosure is generally related to semiconductor devices, and more particularly to field-effect transistors (FETs), such as planar FETs, three-dimensional fin FETs (FinFETs), or nanostructure FETs, such as nanosheet FETs (NSFETs), nanowire FETs (NWFETs), gate-all-around FETs (GAAFETs) and the like.

Integrated memory refers to memory technologies that are built directly onto a microchip or integrated circuit, rather than being separate or "discrete" components. One such technology is Phase Change Random Access Memory (PCRAM). PCRAM is a non-volatile memory technology that has benefits including high density, low power, and fast access.

Phase Change Random Access Memory (PCRAM), also known as Phase Change Memory (PCM), is a type of non-volatile memory that utilizes properties of phase change materials to store information. PCRAM relies on the ability of materials, such as germanium-antimony-tellurium (Ge2Sb2Te5 or "GST") to switch between different phases including crystalline (ordered) and amorphous (disordered). The two phases have different electrical resistances, allowing them to represent binary data (0s and 1s). To write data, a controlled electrical pulse is applied to the material. A high-intensity pulse can melt the material and then quickly cool it, leaving it in an amorphous state with high resistance. A lower-intensity pulse can heat the material enough to crystallize it, leading to a low-resistance state. To read the stored data, a small electric current is passed through the material. By measuring the resistance, the device can determine whether the material is in its crystalline or amorphous phase, thus reading the stored binary data. PCRAM is non-volatile, such that data is retained even when the power is turned off. PCRAM can provide faster write and read speeds compared to some other non-volatile memories like flash. PCRAM can endure a large number of write and erase cycles. A planar memory device may include two separate planar devices, including a single transistor (1T) and a single resistor (1R) that are typically positioned in two separate metal layers. Hence, device density increases become difficult.

In the embodiments, a grounded resistor or "ground fused device" is stacked on a source/drain or source/drain region to reduce passive device area for further device density improvement. Source/drain or source/drain region(s) may refer to a source or a drain, individually or collectively dependent upon the context. A PCRAM device in accordance with various embodiments may be a vertical PCRAM device, and may be referred to as the vertical PCRAM device. For example, the PCRAM device may be used with front-end-of-line (FEOL) planar, fin-type FET or gate-all-around FET (GAAFET) logic devices. Interconnects between the PCRAM device and the logic device(s) may be via a back-end-of-line (BEOL) metal routing. The vertical PCRAM device may be inserted as a vertical gate-all-around PCRAM device between two metal layers in an interconnect structure (e.g., BEOL or backside interconnect), such as between an Mx and Mx+1 metal layer (e.g., M3 and M4, M6 and M7, or the like). The vertical PCRAM device may include a metal-insulator-metal (MIM) fused device on top of or underneath an oxide semiconductor channel, such as an indium-gallium-zinc-oxide (IGZO) channel.

Nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure structure.

Figure 1B:
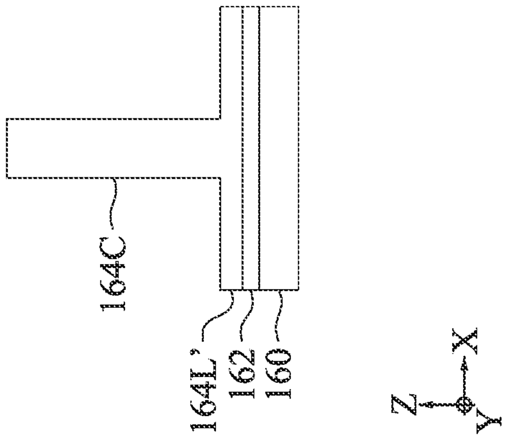
Figure 1A:
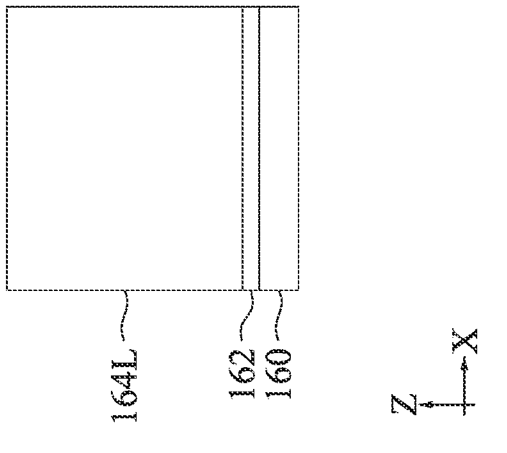
Figure 1F:
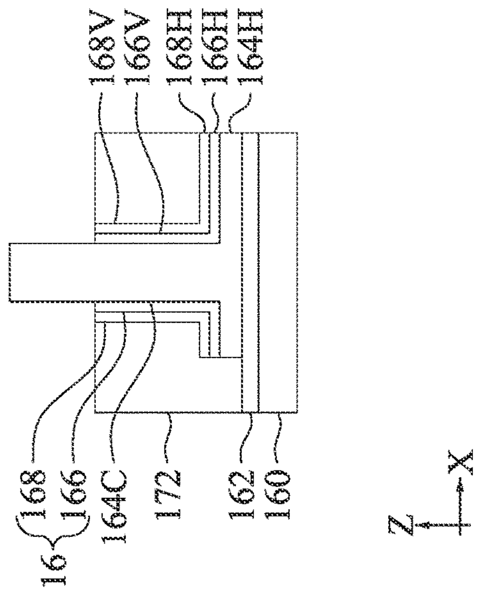
Figure 1E:
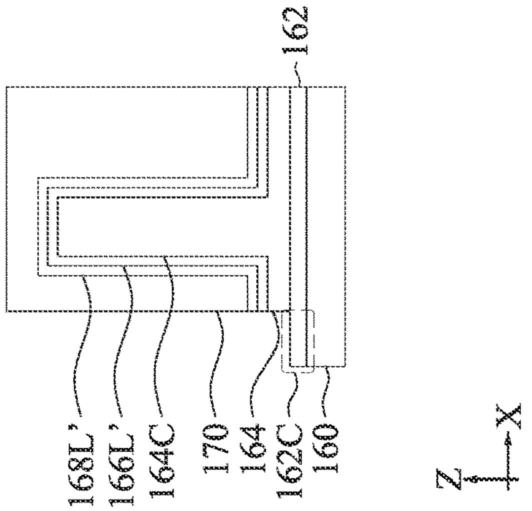
Figure 1D:
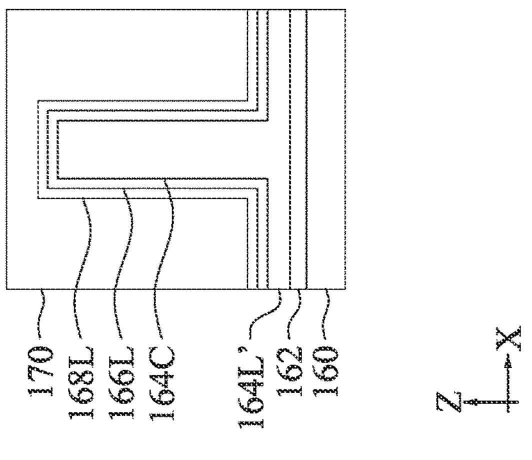
Figure 1I:
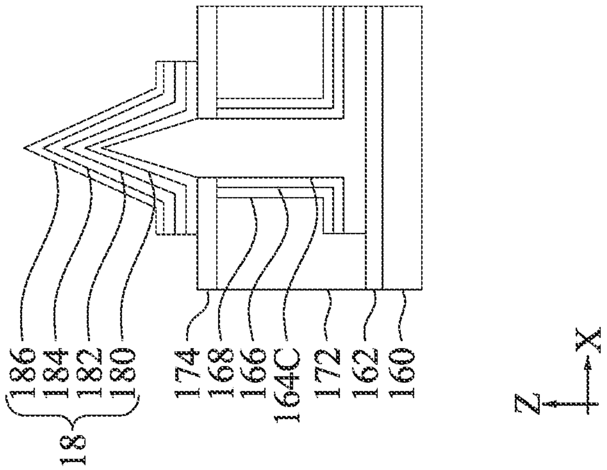
Figure 1H:
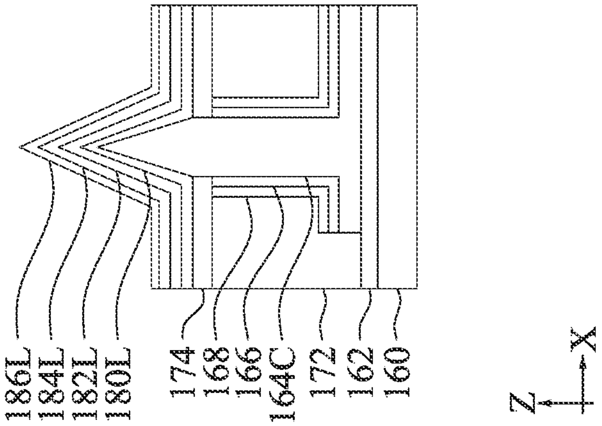
Figure 1G:
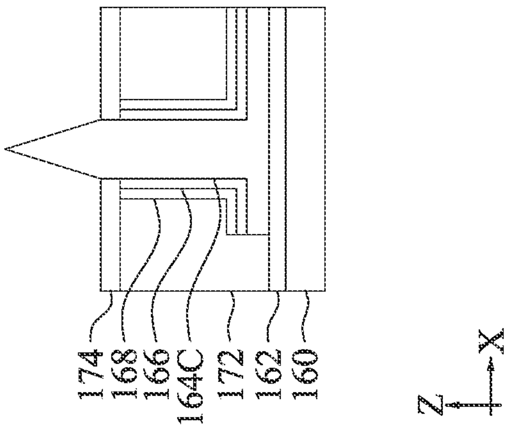
Figure 1K:
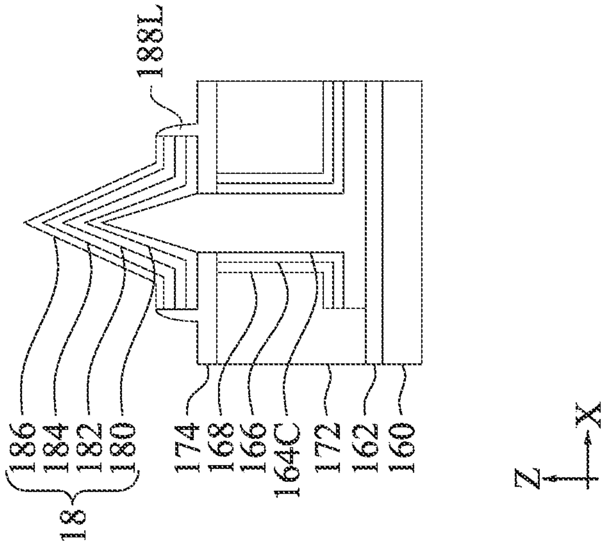
Figure 1J:
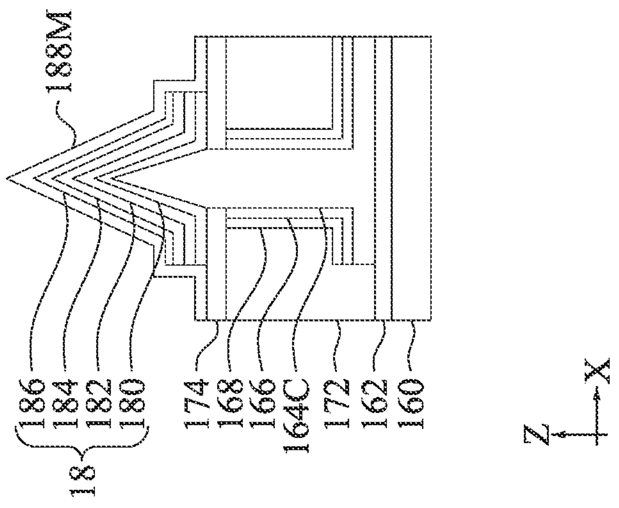
Figure 1L:
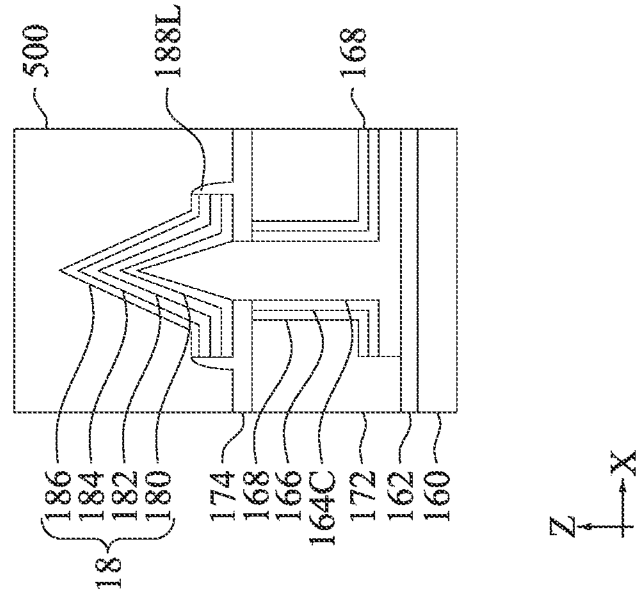
Figure 1M:
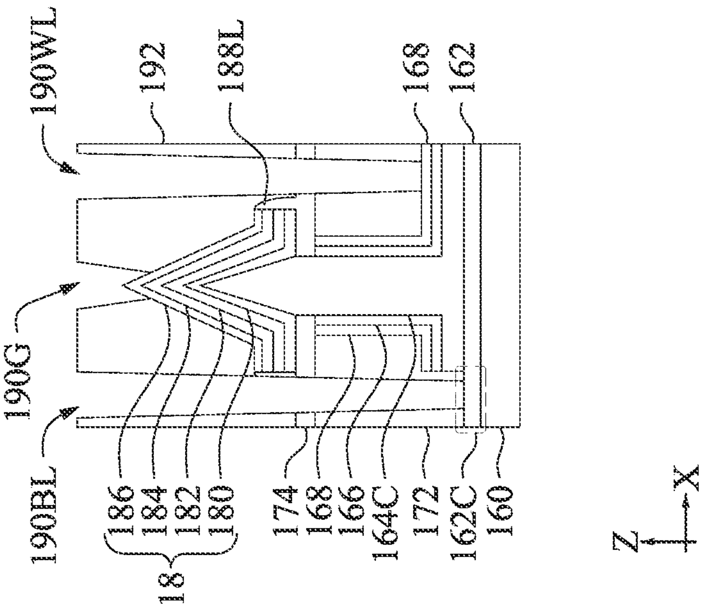
Figure 1O:
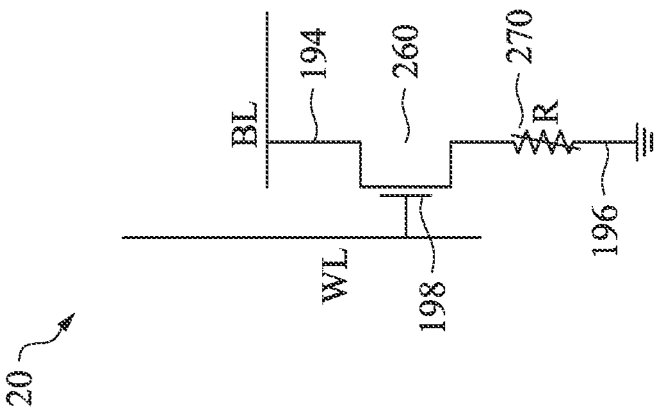
Figure 1N:
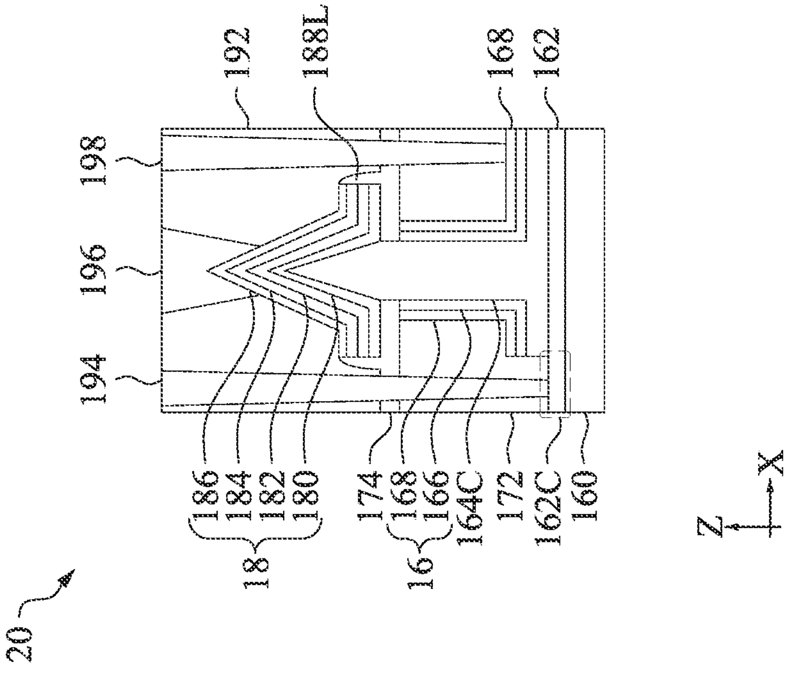
Figure 1P:
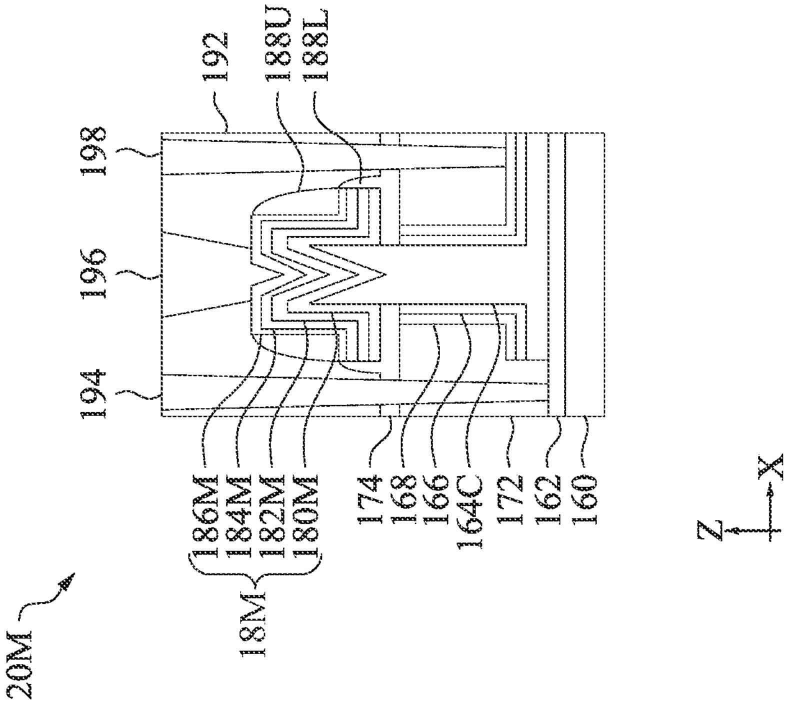
Figure 1Q:
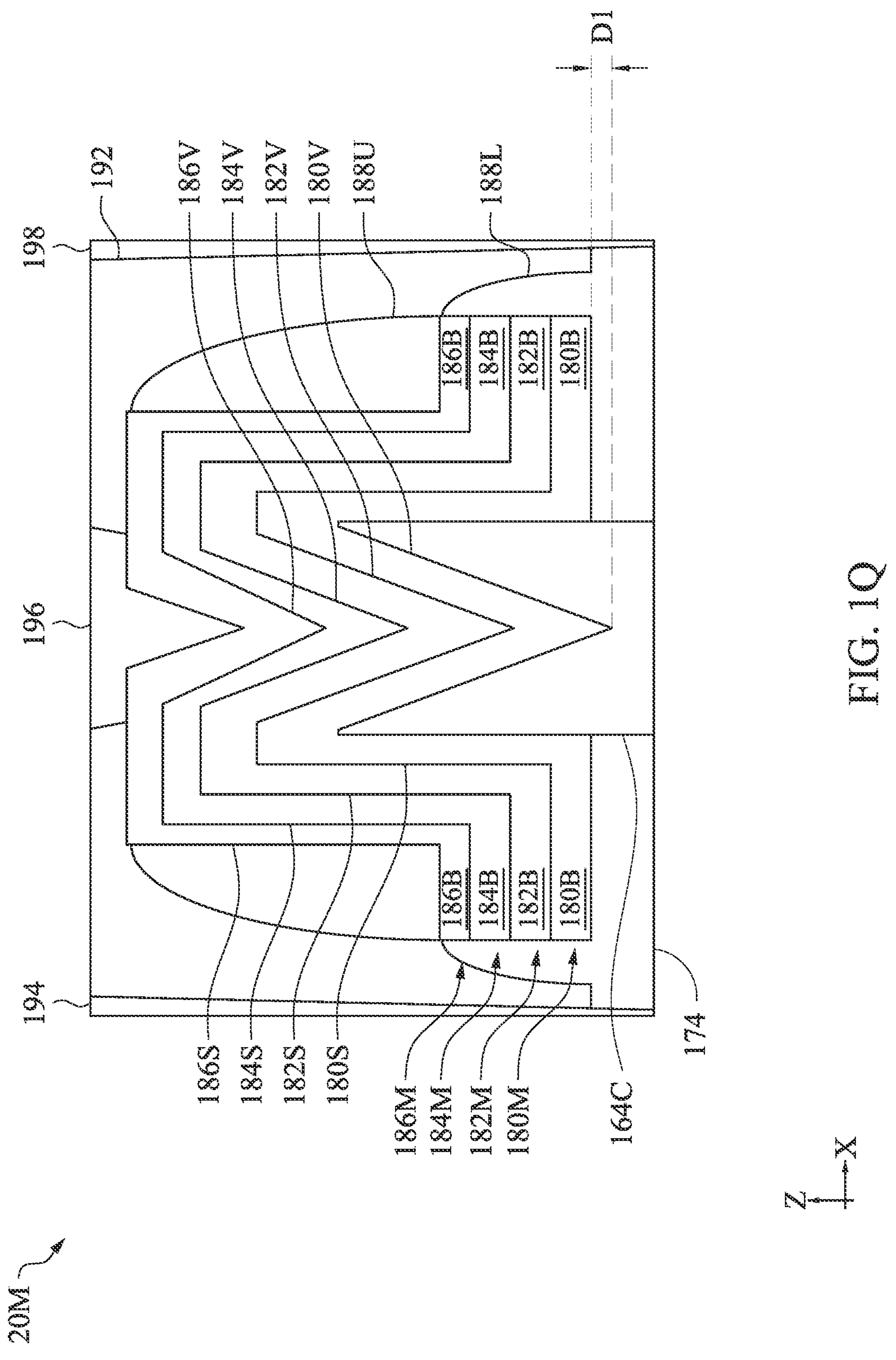
Figure 2B:
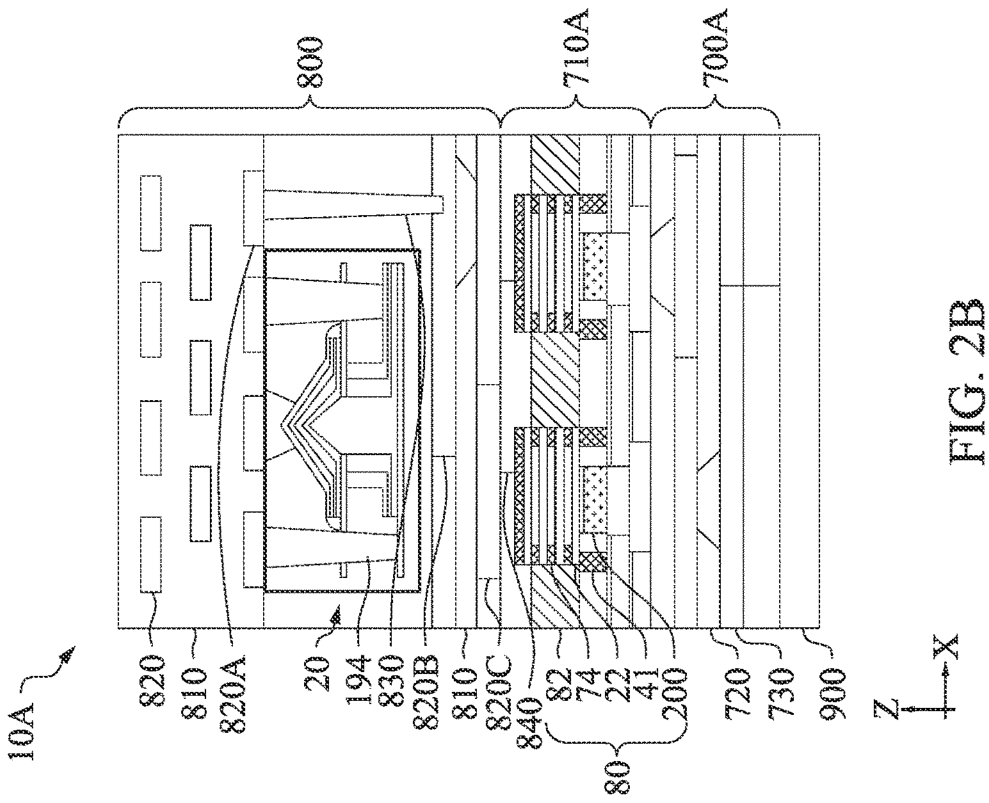
FIGS. 2A and 2B are diagrammatic cross-sectional and circuit diagram views of various embodiments of an IC device according to aspects of the present disclosure.
Figure 2A:
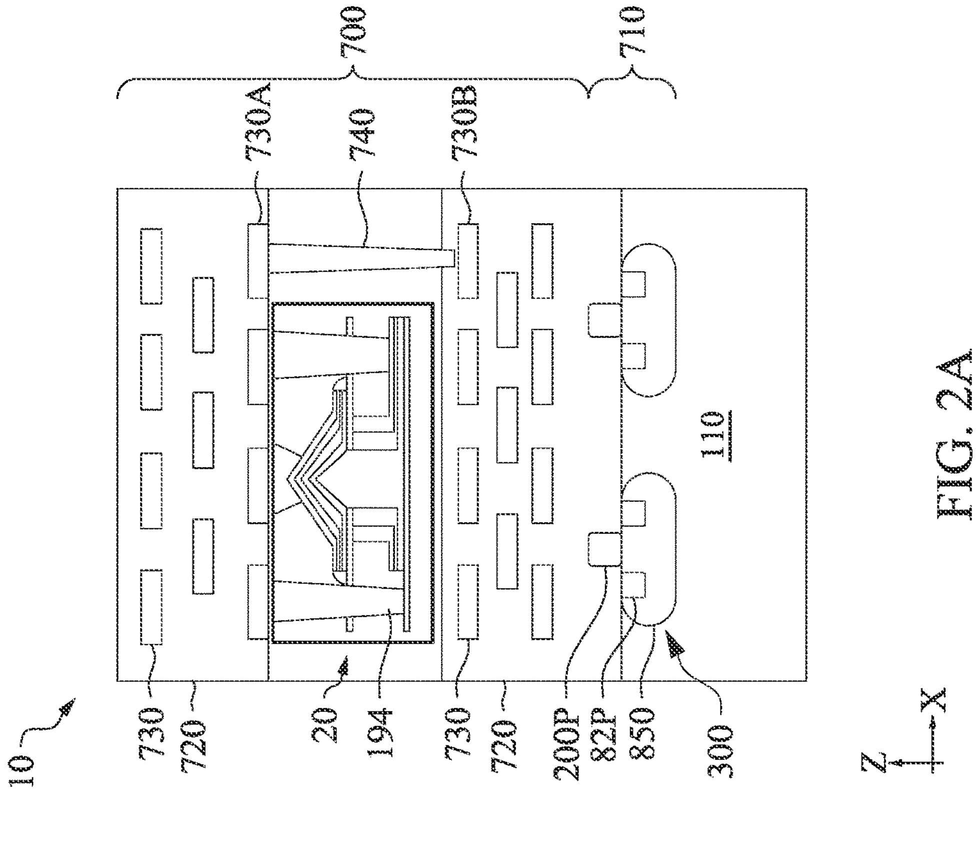
Figure 5:
FIGS. 5 and 6 are flowcharts of methods of forming an IC device in accordance with various embodiments.

FIGS. 1A-1Q are views of various embodiments of memory devices 20, 20M at various stages of fabrication according to aspects of the present disclosure. FIGS. 2A and 2B are diagrammatic cross-sectional and circuit diagram views of various embodiments of IC devices 10, 10A including the memory device 20, 20M according to aspects of the present disclosure. FIG. 5 is a flowchart of a method 1000 of forming a memory device in accordance with various embodiments.

FIG. 5 illustrates a flowchart of method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000 and some acts described can be replaced, eliminated, or moved around for additional embodiments of the method. Not all acts are described herein in detail for reasons of simplicity. Method 1000 is described below in conjunction with fragmentary perspective and/or cross-sectional views of a workpiece, shown in FIGS. 1A-1Q, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

In FIG. 1A, a first electrode layer 162 is formed on a first dielectric layer 160 of an integrated circuit or integrated chip (IC) device. The first dielectric layer 160 may be formed on or may be included in a first portion of an interconnect structure that is on or beneath a device layer, which will be described in greater detail with reference to FIGS. 2A and 2B. Briefly, the device layer may include one or more integrated devices, such as planar FETs, fin-type FETs, nanostructure FETs, metal-oxide-semiconductor (MOS) capacitors and the like. The interconnect structure may be on the device layer, and may include a mid-end-of-line (MEOL) and/or back-end-of-line (BEOL) interconnect structure that provides electrical connection between the integrated devices of the device layer and to other device external to the IC device. The interconnect structure may include instead or additionally a backside interconnect structure on a back side of the device layer. Examples of frontside and backside interconnect structures 700, 800 and planar FET and nanostructure FET device layers 710, 710A are depicted in FIGS. 2A and 2B, respectively. Acts 1010 and 1020 of method 1000, which include forming a device layer (act 1010) and forming a first portion of an interconnect structure on the device layer (act 1020) are described in greater detail with reference to FIGS. 2A and 2B.

The first dielectric layer 160 may be or include an oxide, such as silicon oxide, and may be included in an interconnect structure over or under a device layer. The first dielectric layer 160 may be formed by an appropriate deposition operation, such as chemical vapor deposition (CVD), plasma-enhanced chemical vapor deposition (PECVD), atomic layer deposition (ALD), or the like. The first dielectric layer 160 may be present on a metallization layer that includes metal features (e.g., contacts, traces, wires, vias, or the like) embedded in an intermetal dielectric (IMD). The IMD may be or include silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like.

The first electrode layer 162 is formed on the first dielectric layer 160. In some embodiments, the first electrode layer 162 is or includes a transition metal nitride. For example, the first electrode layer 162 may be or include TiN, TaN, WN, HfN or the like, and may be formed by an appropriate deposition operation, such as a physical vapor deposition (PVD), CVD, low-pressure CVD (LPCVD), PECVD, ALD or the like.

After forming the first electrode layer 162 on the first dielectric layer 160, an oxide semiconductor layer 164L may be formed on the first electrode layer 162, corresponding to act 1030 of method 1000. The oxide semiconductor layer 164L may be or include indium-gallium-zinc-oxide (IGZO). In some embodiments, the oxide semiconductor layer 164L is or includes one or more of IGZO, zinc-tin-oxide (ZTO), aluminum-zinc-oxide (AZO), hafnium-indium-zinc-oxide (HIZO), gallium-zinc-oxide (GZO), indium-gallium-oxide (IGO), zinc-indium-tin-oxide (ZITO), combinations thereof and the like. The oxide semiconductor layer 164L may be formed by an appropriate deposition operation, such as a PVD, CVD, ALD, e-beam evaporation or the like.

In FIG. 1B, following formation of the oxide semiconductor layer 164L, a patterned oxide semiconductor layer 164L' including a channel 164C is formed by patterning the oxide semiconductor layer 164L. The channel 164C may have the shape of a pillar. Namely, the channel 164C may have cross-sectional profile in the XY plane that is circular, square, rectangular, an irregular shape, or the like. A height of the channel 164C in the Z-axis direction over a width of the channel 164C in the X-axis or Y-axis direction may be referred to as an aspect ratio of the channel 164C. The aspect ratio of the channel 164C may be in a range of about 1.5 to about 20, about 2 to about 15, about 4 to about 10, or another suitable range. An aspect ratio that exceeds about 20 may lead to collapse of the channel 164C. An aspect ration that is below about 1.5 may not provide sufficient channel length.

In FIGS. 1C-1F a gate structure 16 (see FIG. 1F) is formed that wraps around the channel 164C, corresponding to act 1040 of method 1000. The gate structure 16 includes a dielectric layer 166 and a gate conductive layer 168.

In FIG. 1C, following formation of the channel 164C that has the pillar shape, a gate dielectric layer 166L is formed on the oxide semiconductor layer 164L' including the channel 164C. The gate dielectric layer 166L wraps around and covers the channel 164C. Namely, the gate dielectric layer 166L may be in direct contact with sidewalls and an upper surface of the channel 164C. The gate dielectric layer 166L may be or include at least one dielectric material, such as SiO2, or a high-k gate dielectric material, which may refer to dielectric materials having a high dielectric constant that is greater than a dielectric constant of silicon oxide (k≈3.9). Example high-k dielectric materials include HfO2, HfSiO, HfSION, HfTaO, HfTiO, HfZrO, ZrO2, $Ta2O_5$, or combinations thereof. In some embodiments, the gate dielectric layer 166L includes one or more of SiO2, HfO, La, SiON, SiCON, Zn or Zr. In some embodiments, the gate dielectric layer 166L has thickness of about 5 Angstroms (Å) to about 100 A. The high-k dielectric material(s) may be deposited by ALD, CVD, PVD, molecular beam epitaxy (MBE), or the like.

Further to FIG. 1C, following formation of the gate dielectric layer 166L, the gate conductive layer 168L is formed on the gate dielectric layer 166L. The gate conductive layer 168L may be in direct contact with the gate dielectric layer 166L. For example, the gate conductive layer 168L may be in direct contact with sidewalls and upper surfaces of the gate dielectric layer 166L. The gate conductive layer 168L may include a conductive material such as polysilicon, silicon, titanium, tantalum, aluminum, tungsten, nickel, zinc, indium, gallium, germanium, carbon, cobalt, ruthenium, iridium, molybdenum, copper, or combinations thereof. The conductive material may be deposited by an appropriate deposition operation, such as a CVD, PVD, ALD, e-beam evaporation, or the like. In some embodiments, the gate conductive layer 168L has thickness of about 5 A to about 100 A.

In FIG. 1D, following formation of the gate conductive layer 168L, a mask layer 170, which may be or include an oxide layer, is formed on the structure depicted in FIG. 1C. The oxide layer 170 may be a blanket layer that covers the gate conductive layer 168L. The oxide layer 170 may be formed by any of the methods described above with reference to the oxide layer 160.

In FIG. 1E, following deposition of the oxide layer 170, the oxide layer 170 is patterned to expose an electrode contact portion 162C, highlighted in FIG. 1E in phantom. After patterning the oxide layer 170, exposed portions of the gate conductive layer 168L, the gate dielectric layer 166L and the oxide semiconductor layer 164L' are removed to expose the electrode contact portion 162C. The oxide layer 170 may be etched by reactive ion etching (RIE), wet etching, plasma etching, inductively coupled plasma (ICP) etching, or the like. Following patterning of the oxide layer 170, exposed portions of the gate conductive layer 168L may be etched, for example, by an RIE, ICP etch, or the like, that uses an etchant such as CF4, resulting in a gate conductive layer 168L'. Then, the gate dielectric layer 166L may be etched, for example, by a dry etch, such as RIE, ICP etch, or the like, that uses a chlorine- or fluorine-based etchant, resulting in a gate dielectric layer 166L'. Then, the oxide semiconductor layer 164L' may be etched, for example, by a dry etch, such as an RIE, ICP etch or the like, that uses a chlorine- or fluorine-based etchant, resulting in a channel layer 164.

In FIG. 1F, following formation of the gate conductive layer 168L', the gate dielectric layer 166L' and the channel layer 164, portions of the gate conductive layer 168L' and the gate dielectric layer 166L' on an upper region of the channel 164C are removed. In some embodiments, following the operations of FIG. 1F, the oxide layer 170 is removed and another oxide layer 172 is formed. The oxide layer 172 is then recessed to a level that is below an upper surface of the channel 164C, for example, by a chemical mechanical planarization (CMP), anisotropic etch, combination thereof, or the like. After recessing, the portions of the gate conductive layer 168L' and the gate dielectric layer 166L' on the upper region of the channel 164C are exposed. In some embodiments, a portion of the channel 164C that protrudes from the oxide layer 172 has height that is in a range of about $1/10^{th}$ to about $2/3^{rd}$ total height of the channel 164C.

Following recessing of the oxide layer 172, exposed portions of the gate conductive layer 168L' and the gate dielectric layer 166L' on the upper region of the channel 164C are removed. The removal may be similar to that described with reference to FIG. 1E, including similar etching processes and chemistries. Following removal of the exposed portions, a gate conductive layer 168 and a gate dielectric layer 166 remain, the resulting structure being depicted in FIG. 1F. The gate dielectric layer 166 includes vertical portion(s) 166V that wrap around the channel 164C and horizontal portions 166H that cover horizontal portions 164H of the oxide semiconductor layer 164. The gate conductive layer 168 includes vertical portion(s) 168V that wrap around the channel 164C and horizontal portions 168H that cover horizontal portions 166H, 164H of the gate dielectric layer 166 and the oxide semiconductor layer 164, respectively.

In FIGS. 1G-1I, a fused device 18 is formed on the exposed upper portion of the channel 164C, corresponding to act 1050 of method 1000. The fused device 18 may be a MIM device. The fused device 18 may be a phase change resistor, and may include one or more of the following layers: bottom electrode, phase change material (PCM) layer, heater or heating layer, top electrode, passivation or dielectric layer (optional), encapsulation (optional).

In FIG. 1G, an insulating layer 174 is formed that covers the gate dielectric layer 166 and the gate conductive layer 168. The insulating layer 174 provides electrical isolation between the gate structure 16 and the fused device 18 that is formed in subsequent operations. In some embodiments, the insulating layer 174 is a dielectric layer that includes one or more of SiN, SiCN, SiON, SiOCN, SiOC, or the like. The insulating layer 174 may be formed by blanket depositing a conformal layer of one or more of the mentioned dielectrics on the structure depicted in FIG. 1F. The deposition may be by a suitable deposition operation, such as a CVD, LPCVD, PECVD, ALD, PVD, MBE or the like. The insulating layer 174 may be recessed following deposition so as to expose an upper region of the channel 164C.

In FIG. 1G, an upper portion of the channel 164C that extends above the insulating layer 174 may have tapered sidewalls in the XZ plane. For example, the upper portion may be conical or pyramidal in perspective view. The tapered sidewalls may form or come together as a sharp tip as depicted in FIG. 1G. In some embodiments, the tapered sidewalls form a rounded or blunt tip instead of a sharp tip.

In FIG. 1H, following deposition of the insulating layer 174, material layers for forming the fused device 18 may be deposited in sequence as blanket conformal layers that cover the channel 164C and the insulating layer 174. The blanket conformal layers inherit the tip shape of the upper portion of the channel 164C.

First, a bottom electrode layer 180L may be formed. The bottom electrode layer 180L may include a transition metal nitride, such as TiN, or another conductive material, such as tungsten. The bottom electrode layer 180L may be formed by a suitable deposition operation, such as an ALD, CVD, or the like.

Following formation of the bottom electrode layer 180L, a PCM layer 182L may be formed. The PCM layer 182L may be a layer that has phase change properties as described previously, and may include GST. In some embodiments, the PCM layer 182L includes GeTe, SbTe, SbSeTe, GeSbSe, GaSb, GaSbTe, SiSbTe, GeCuTe, GeCrTe, InSbTe, AgInSbTe, SnSb, combinations thereof, and the like. The PCM layer 182L may be formed by a suitable deposition operation, such as an ALD, CVD or the like.

Following formation of the PCM layer 182L, a heating or heater layer 184L may be formed. The heater layer 184L may be a layer of tungsten. The tungsten layer may be formed by a suitable deposition operation on the PCM layer 182L, such as by an ALD, CVD or the like.

Following formation of the heater layer 184L, a top electrode layer 186L may be formed thereon. The top electrode layer 186L may include a transition metal nitride, such as TIN, or another conductive material, such as tungsten. The top electrode layer 186L may be formed by a suitable deposition operation, such as an ALD, CVD, or the like. In some embodiments, the top electrode layer 186L is the same material or substantially the same material as the bottom electrode layer 180L.

In FIG. 1I, following formation of the bottom electrode layer 180L, the PCM layer 182L, the heater layer 184L and the top electrode layer 186L, a patterning operation is performed to form the fused device 18. The patterning may include one or etching operations that remove some portions of each of the bottom electrode layer 180L, the PCM layer 182L, the heater layer 184L and the top electrode layer 186L between neighboring channels 164C so as to form individual fused devices 18 over each channel 164C that are electrically and physically isolated from each other. In addition, removing material of the bottom electrode layer 180L, the PCM layer 182L, the heater layer 184L and the top electrode layer 186L between the channels 164C opens up space for forming contacts to the first electrode layer 162 and the gate conductive layer 168, which is described in greater detail with reference to FIGS. 1L-1N below. Removal of the bottom electrode layer 180L, the PCM layer 182L, the heater layer 184L and the top electrode layer 186L may be by RIE, ICP etch, or the like. A resulting structure in which the fused device 18 includes a bottom electrode 180, a PCM layer 182, a heater layer 184 and a top electrode 186 is depicted in FIG. 1I.

In FIGS. 1J and 1K, spacers 188L are formed on the fused device 18, corresponding to act 1060 of method 1000. The spacers 188L include a lower spacer 188L that wraps around a lower portion of the fused device 18. The spacers 188L are beneficial to provide protection during formation of contacts, and to provide physical isolation and electrical isolation between the fused device 18 and the contacts after formation.

In FIG. 1J, a spacer material layer 188M is formed on the fused devices 18 and the insulating layer 174. The spacer material layer 188M may be or comprise one or more of SiN, SiCN, SiC, SiOC, SiOCN, HfO2, ZrO2, ZrAlOx, HfAlOx, HfSiOx, Al2O3, or other suitable material. The spacer material layer 188M may be formed by a suitable deposition operation, such as a LPCVD, PECVD, high-density plasma CVD (HDPCVD), ALD, or the like. The spacer material layer 188M may be blanket deposited as a conformal thin layer on the fused device 18 and exposed regions of the insulating layer 174, resulting in the structure shown in FIG. 1J.

In FIG. 1K, the spacer material layer 188M is etched to remove horizontal portions thereof overlying the top electrode 186 and the insulating layer 174. The etching may include RIE, ICP, wet etching or another suitable etch operation. Following etching, lower spacers 188L remain on the fused device 18, as depicted in FIG. 1K. The lower spacer 188L may wrap around a lower region of the fused device 18, may be positioned adjacent (and in direct contact with) sidewalls or terminuses of horizontal portions of the top electrode 186, the heater layer 184, the PCM layer 182 and the bottom electrode 180, and may be positioned on an upper surface of the insulating layer 174. The lower spacers 188L may each have a rounded profile. Namely, outer sidewalls thereof may be rounded instead of vertical following the etching operation.

In FIGS. 1L-1N, contacts 194, 196, 198 are formed that land on the electrode contact portion 162C, the top electrode 186 and the gate conductive layer 168, respectively, corresponding to act 1070 of method 1000. The contacts 194, 196, 198 provide electrical connection to the PCRAM device 20. For example, a bit line (BL), word line (WL) and ground (or other bias voltage) may be connected to the PCRAM device 20 via the contacts 194, 196, 198, which may carry voltages that are applied to the electrode contact portion 162C, the top electrode 186 and the gate conductive layer 168 to program, erase or otherwise operate the PCRAM device 20. FIG. 1O is a simple circuit schematic diagram of the PCRAM device 20 in accordance with various embodiments.

In FIG. 1L, a mask layer 500 is formed over the fused device 18 and the insulating layer 174. The mask layer 500 may be or comprise an oxide layer, such as a silicon oxide, and may be deposited by any of the methods described above for the mask layer 170.

In FIG. 1M, openings 190BL, 190G, 190WL are formed in the mask layer 500 and the underlying structure to expose the electrode contact portion 162C, the top electrode 186 and the gate conductive layer 168. For example, the openings 190BL, 190G, 190WL may be formed initially through the mask layer 500 and land on the insulating layer 174 and the top electrode 186. Then, the openings 190BL, 190WL may be extended through the insulating layer 174 and the oxide layer 172 to expose the electrode contact portion 162C and the gate conductive layer 168. The openings 190BL, 190G, 190WL may be formed by one or more appropriate etch operations, such as an RIE, ICP, or the like.

In FIG. 1N, a source/drain contact 194, a gate contact 198 and a top electrode contact 196 (or collectively "the contacts 194, 196, 198") are formed in the openings 190BL, 190WL, 190G, respectively. The contacts 194, 196, 198 may be or include one or more of a liner layer, barrier layer, glue layer, conductive core layer, and the like. In some embodiments, the contacts 194, 196, 198 include one or more of Cu, Co, Al, Ni, W, Ru, Ti, TiN, Ta, TaN, alloys thereof, multilayers thereof, combinations thereof, or the like. The layer(s) of the contacts 194, 196, 198 may be formed by one or more appropriate deposition operations, such as a PVD, CVD, ALD, or the like.

In FIG. 1O, the PCRAM device 20 may be represented in simple circuit form as a 1T1R ("one transistor, one resistor") circuit that includes a transistor 260 and a resistor 270, which may be a phase change resistor 270. The gate conductive layer 168, the gate dielectric layer 166 and the channel 164C may be included in a transistor 260. The gate conductive layer 168 or gate electrode of the transistor 260 may be connected to a word line WL via the contact 198. A source/drain electrode of the transistor 260, which may be the first electrode layer 162, may be connected to a bit line BL via the contact 194. The top electrode 186 of the fused device 18, which may be the phase change resistor 270, may be connected to a bias voltage (e.g., ground) via the contact 196.

Following formation of the contacts 194, 196, 198, a second portion of the interconnect structure may be formed on the contacts 194, 196, 198, corresponding to act 1080 of method 1000. A front side interconnect structure 700 and a back side interconnect structure 800A including a first portion and a second portion with an PCRAM device 20 therebetween are depicted in FIG. 2A and FIG. 2B.

FIGS. 1P and 1Q are diagrams that illustrate an M-shaped fused device 18M in accordance with various embodiments.

In FIG. 1P, the fused device 18M has an M-shaped cross-sectional profile in the XZ plane and/or the YZ plane. The M shape may be due to etching of the upper portion of the channel 164C that protrudes above the insulating layer 174. Namely, a center region of the upper portion may be recessed to have an inverted cone or inverted pyramid cutout shape in perspective view. In some embodiments, after etching the upper portion, the subsequent layers formed thereon inherit the inverted cone or inverted pyramid shape, as depicted in FIG. 1P. Namely, each of the bottom electrode 180M, the PCM layer 182M, the heater layer 184M and the top electrode 186M may have tapered sidewalls that meet in respective points within the channel 164C. Due to the angular or sharp-tipped profile of the top electrode 186M, contact area between the contact 196 and the top electrode 186M may be increased, which may be beneficial to reduce contact resistance therebetween and improve performance of the PCRAM device 20M that includes the fused device 18M.

FIG. 1Q is a detailed view of the fused device 18M of the PCRAM device 20M of FIG. 1P in accordance with various embodiments. As depicted, each of the bottom electrode 180M, the PCM layer 182M, the heater layer 184M and the top electrode 186M may include horizontal portions 180B, 182B, 184B, 186B, vertical sidewall portions 180S, 182S, 184S, 186S and V-shaped portions 180V, 182V, 184V, 186V, respectively. The V-shaped portions 180V, 182V, 184V, 186V are V-shaped in cross-section, but may be conical or pyramidal in perspective view.

The V-shaped portion 180V may increase contact area between the channel 164C and the bottom electrode 180M, which may improve (e.g., reduce) contact resistance therebetween and improve device performance. Namely, in addition to being in contact (e.g., direct contact) with the channel 164C via the vertical sidewall portion 180S, contact area between the upper surface of the channel 164C and the bottom electrode 180M is increased by the V-shaped portion 180V that extends into the channel 164C. In some embodiments, the V-shaped portion 180V of the bottom electrode 180M may extend below the horizontal portion 180B thereof by a distance D1. The distance D1 may be in a range of about 10 A to about 10 nm. In some embodiments, the V-shaped portion 180V extends to the same level as the lower surface of the horizontal portion 180B or to a level that is above the lower surface or the upper surface of the horizontal portion 180B. Although the V-shaped portion 180V is depicted as having a sharp tip, in some embodiments, the V-shaped portion 180V may instead have a rounded or blunted tip. In some embodiments, the V-shaped portion 180V is not formed and instead a U-shaped portion is formed.

FIGS. 2A and 2B are diagrammatic cross-sectional views of the PCRAM device 20 included in IC devices 10, 10A in accordance with various embodiments. In FIG. 2A, the PCRAM device 20 is included in a front side interconnect structure 700. In FIG. 2B, the PCRAM device 20 is included in a back side interconnect structure 800A. It should be understood that some embodiments of an IC device may include the PCRAM device 20 in both a front side interconnect structure and a back side interconnect structure, which may be beneficial to increase density of PCRAM devices per unit area of the IC device. It should also be understood that planar transistors 300 are depicted in FIG. 2A and nanostructure transistors 80 (e.g., GAAFETs) are depicted in FIG. 2B only for purposes of illustration. The nanostructure transistors 80 can also be used in the arrangement depicted in FIG. 2A and the planar transistors 300 can also be used in the arrangement depicted in FIG. 2B. Other transistor types (e.g., FinFETs) may be included instead of the planar transistors 300 and the nanostructure transistors 80 in the IC devices 10, 10A in accordance with various embodiments.

In FIG. 2A, the IC device 10 includes a substrate 110, a device layer 710 on and/or in the substrate 110 and a front side interconnect structure 700 on the device layer 710 that includes the PCRAM device 20. The device layer 710 in FIG. 2A is depicted as including planar transistors 300. In some embodiments, the device layer 710 may include fin-type transistors, nanostructure transistors (e.g., GAAFETs) and the like.

The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; other compound semiconductors including gallium, zinc, indium and/or oxygen; or combinations thereof. Other substrates, such as single-layer, multi-layered, or gradient substrates may be used.

The planar transistors 300 include source/drains 82P and a gate structure 200P, and may be formed on and in wells 850 in the substrate 110.

The source/drains 82P may be heavily doped regions of the substrate 110 in the wells 850 that are doped with impurities to form either n-type (with donor impurities like phosphorus or arsenic) semiconductor for NMOS or p-type (with acceptor impurities like boron) semiconductor for PMOS. Between the source/drain regions 82P is a channel that is lightly doped with the opposite type of impurity compared to the source/drain regions 82P. For example, an NMOS may have a p-type channel (e.g., with boron), and a PMOS may have an n-type channel (e.g., with phosphorus). In some embodiments, the source/drains 82P are doped with carbon.

The gate structure 200P may be or include polysilicon ("polycrystalline silicon") or a metal such as tungsten. The gate structure 200P may include an insulating layer or "gate dielectric" that may be or include silicon dioxide (SiO2) or a high-k dielectric, such as hafnium oxide (HfO2) that is beneficial to reduce leakage and improve performance.

Although not separately depicted in FIG. 2A, contacts that provide electrical connection to the source/drains 82P and the gate structure 200P may be present. The contacts may include tungsten (W), aluminum (Al) or another suitable conductive material. The contacts may include one or more barrier layers, such as titanium nitride, and adhesion layers that may be used to improve physical contact and reduce diffusion.

The front side interconnect structure 700 is on the gate structure 200P, the source/drains 82P and the substrate 110. The front side interconnect structure 700 may include conductive features 730 embedded in dielectric layers 720. For example, the front side interconnect structure 700 may include one or more metal layers (e.g., M0, M1, M2, . . . , $M_N$), each of which includes the dielectric layer 720, which may be an intermetal dielectric (IMD) layer. Each IMD layer may be or include one or more of silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG) or a combination thereof. Conductive features 730 may be connected to each other by conductive vias 740. For example, a first conductive feature 730A may be connected to a second conductive feature 730B by a conductive via 740. The conductive features 730, 730A, 730B and the conductive vias 740 may be or include one or more of a metal, such as copper, aluminum, TiN, TaN, Ta, graphene, carbon nanotubes, conductive polymer, combinations thereof and the like.

The PCRAM device 20 may be positioned between two or more of the metal layers. For example, the PCRAM device 20 may be positioned between a third metal layer (M3) and a fourth metal layer (M4). In some embodiments, the PCRAM device 20 is positioned between two metal layers that are more than one level apart. For example, the PCRAM device 20 may be positioned between a fourth metal layer (M4) and a sixth metal layer (M6) or seventh metal layer (M7).

In FIG. 2B, the PCRAM device 20 is positioned in a back side interconnect structure 800. The back side interconnect structure 800 is similar in many respects to the front side interconnect structure 700 of FIG. 2A, but may be formed on a backside of a device layer 710A. For example, the substrate 110 may be removed partially or entirely, and contact to source/drains 82 may be from a back side of the source/drains 82, as depicted in FIG. 2A. The back side interconnect structure 800A may include conductive features 820 embedded in dielectric layer 810. A front side interconnect structure 700A is depicted in FIG. 2B. The front side interconnect structure 700A is similar in most respects to the front side interconnect structure 700 and includes conductive features 730 embedded in dielectric layers 720. In some embodiments, a semiconductor layer 900 is positioned on the front side interconnect structure 700A opposite the device layer 710A. The semiconductor layer 900 may be undoped silicon.

FIG. 2B also depicts the device layer 710A including nanostructure transistors 80 instead of planar devices 300. A single nanostructure transistor 80 is described in the following. The nanostructure transistors 80 may be or include one or more N-type FETs (NFETs) or P-type FETs (PFETs). Nanostructure transistors 80 may be separated (e.g., physically and/or electrically isolated) from each other by shallow trench isolation (STI), deep trench isolation (DTI), local oxidation of silicon (LOCOS), or the like.

The nanostructure transistor 80 is formed over and/or in a substrate 110, and generally includes a gate structure 200 that straddles and/or wraps around semiconductor channels or nanostructures 22. The gate structure 200 controls electrical current flow through the channels 22.

The nanostructure transistor 80 is shown including four channels 22, which are laterally abutted by source/drain features or regions 82 and covered and surrounded by the gate structure 200. Generally, the number of channels 22 is two or more, such as three or four or more. The gate structure 200 controls flow of electrical current through the channels 22 to and from the source/drain features 82 based on voltages applied at the gate structure 200 and at the source/drain features 82.

In some embodiments, the nanostructure device includes an NFET, and the source/drain features 82 thereof include silicon phosphorous (SiP), SiAs, SiSb, SiPAs, SiP:As:Sb, combinations thereof, or the like. In some embodiments, the nanostructure device 20 includes a PFET, and the source/drain features 82 thereof include silicon germanium (SiGe), either undoped or doped to form, for example, SiGe:B, SiGe:B:Ga, SiGe:Sn, SiGe:B:Sn, or another appropriate semiconductor material. Generally, the source/drain features 82 may include any combination of appropriate semiconductor material(s) and appropriate dopant(s).

The channels 22 each include a semiconductive material, for example silicon or a silicon compound, such as silicon germanium, or the like. The channels 22 are nanostructures (e.g., having sizes that are in a range of a few nanometers) and may also each have an elongated shape and extend in the X-direction. In some embodiments, the channels 22 each have a nanowire (NW) shape, a nanosheet (NS) shape, a nanotube (NT) shape, or other suitable nanoscale shape. The cross-sectional profile of the channels 22 may be rectangular, round, square, circular, elliptical, hexagonal, or combinations thereof.

In some embodiments, the lengths (e.g., measured in the X-direction) of the channels 22 may be different from each other, for example due to tapering during a fin etching process. The channels 22 each may not have uniform thickness (e.g., along the X-axis direction), for example due to a channel trimming process used to expand spacing (e.g., measured in the Z-axis direction) between the channels 22 to increase gate structure fabrication process window. For example, a middle portion of each of the channels 22 may be thinner than the two ends of each of the channels 22. Such shape may be collectively referred to as a "dog-bone" shape.

In some embodiments, the spacing between the channels 22 in the vertical direction is in a range between about 8 nanometers (nm) and about 12 nm. In some embodiments, a thickness (e.g., measured in the Z-direction) of each of the channels 22 is in a range between about 5 nm and about 8 nm. In some embodiments, a width (e.g., measured in the Y-direction) of each of the channels 22 is at least about 8 nm.

The gate structure 200 is disposed over and between the channels 22 respectively. In some embodiments, the gate structure 200 is disposed over and between the channels 22 which are silicon channels for N-type devices or silicon germanium channels for P-type devices. In some embodiments, the gate structure 200 includes an interfacial layer (IL), one or more gate dielectric layers, one or more work function tuning layers and a metal core layer.

The interfacial layer, which may be an oxide of the material of the channels 22 is formed on exposed areas of the channels 22. The interfacial layer promotes adhesion of the gate dielectric layers to the channels 22. In some embodiments, the interfacial layer has thickness of about 5 Angstroms (A) to about 50 Angstroms (A). In some embodiments, the interfacial layer has thickness of about 10 A. The interfacial layer having thickness that is too thin may exhibit voids or insufficient adhesion properties. The interfacial layer being too thick consumes gate fill window, which is related to threshold voltage tuning and resistance. In some embodiments, the interfacial layer is doped with a dipole, such as lanthanum, for threshold voltage tuning.

In some embodiments, the gate dielectric layer includes at least one high-k gate dielectric material, which may refer to dielectric materials having a high dielectric constant that is greater than a dielectric constant of silicon oxide (k≈3.9). Example high-k dielectric materials include $HfO_2$, HfSiO, HfSION, HfTaO, HfTiO, HfZrO, $ZrO_2$, $Ta_2O_5$, or combinations thereof. In some embodiments, the gate dielectric layer has thickness of about 5 Å to about 100 A. The gate dielectric layer may be a single layer or a multilayer that is formed on the IL.

The gate structure 200 also includes metal core layer on the gate dielectric layer. The metal core layer may include a conductive material such as Co, W, Ru, combinations thereof, or the like. In some embodiments, the metal core layer is or includes a Co-, W- or Ru-based compound or alloy including one or more elements, such as Zr, Sn, Ag, Cu, Au, Al, Ca, Be, Mg, Rh, Na, Ir, W, Mo, Zn, Ni, K, Co, Cd, Ru, In, Os, Si, Ge, Mn, combinations thereof, or the like. Between the channels 22, the metal core layer is circumferentially surrounded (in the cross-sectional view) by the one or more work function metal layers, which are then circumferentially surrounded by the gate dielectric layers, which are circumferentially surrounded by the interfacial layer. The gate structure 200 may also include a glue layer that is formed between the one or more work function layers and the metal core layer to increase adhesion. The glue layer is not specifically illustrated in FIG. 2B for simplicity.

The nanostructure transistor 80 may include gate spacers 41 that are disposed on sidewalls of the metal core layer, the gate dielectric layer and the IL above the uppermost channel 22, and inner spacers 74 that are disposed on sidewalls of the IL and/or the gate dielectric layer between the channels 22. The inner spacers 74 are also disposed between the channels 22. In the embodiment depicted in FIG. 2B, the gate spacers 41 include two spacer layers. In some embodiments, the gate spacers 41 include a single spacer layer or three or more spacer layers. The first and second spacer layers may each include a dielectric material, for example a low-k material such as SiOCN, SiON, SiN, SiCN, SiOC or the like. In some embodiments, the second spacer layer is not present. Material of the first and second spacer layers may be the same as or different from each other. Generally, an upper portion of the second spacer layer (or the first spacer layer when the second spacer layer is not present) may be removed partially or fully to increase aspect ratio of an opening through which the source/drain region 82 is formed.

Contact to the source/drains 82 from the back side of the device layer 710A may be by a conductive back side via 840. The back side via 840 may be in contact with one or more of the source/drains 82 and with a conductive feature 820 in a back side metal layer (e.g., "BM0," "BM1," or the like).

The PCRAM device 20 may be positioned between two of the back side metal layers, such as between a second back side metal layer (BM2) and a third or fourth back side metal layer (BM3, BM4). A conductive via 830 may extend adjacent the PCRAM device 20 and may connect a conductive feature 820A of a metal layer above the PCRAM device 20 to a conductive feature 820B of a metal layer below the PCRAM device 20. "Above" and "below" in this description may refer to orientation of the page and are interchangeable based on orientation of the IC device 10A. Namely, when the back side of the IC device 10A is facing up, as depicted in FIG. 2B, the conductive feature 820A is "above" the conductive feature 820B.

In some embodiments, the conductive feature 820B is a power rail of the back side interconnect structure 800. The back side interconnect structure 800 may include at least two power rails 820B, 820C. A first power rail 820C connects to logic devices (e.g., the nanostructure transistor 80) and a second power rail 820B connects to the PCRAM device 20. The first power rail 820C may have dimension that is equal to or smaller than dimension of the second power rail 820B. For example, the second power rail 820B that is used for driving the PCRAM device 20 may carry a voltage that exceeds voltage carried by the first power rail 820C. The larger dimension(s) of the second power rail 820B may be beneficial to improve reliability under the higher voltage carried thereon. In some embodiments, the power rails 820B, 820C are or include W, Ru, Ir, Mo or the like.

In the embodiments described with reference to FIGS. 1A-2B, the contact 194 that connects the bit line BL to the drain of the transistor 260 via the first electrode layer 162 is connected to an upper metal layer. In some embodiments, instead of connecting to the upper metal layer as depicted in FIGS. 2A and 2B, the contact 194 may be formed prior to formation of the PCRAM device 20 such that the first electrode layer 162 may be connected to a lower metal layer. In such an embodiment, the operation depicted in FIG. 1E may be omitted.

Figure 3C:
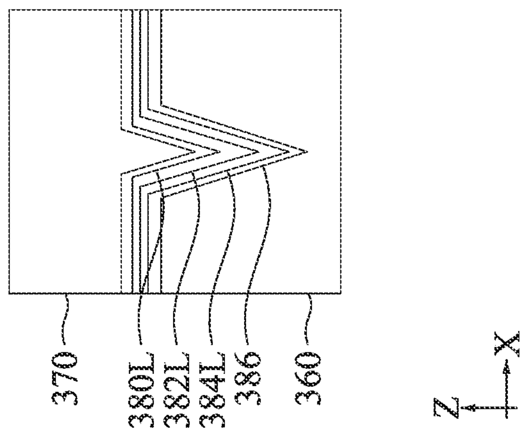
FIGS. 3A-3U are views of various embodiments of an IC device at various stages of fabrication according to aspects of the present disclosure.
Figure 3B:
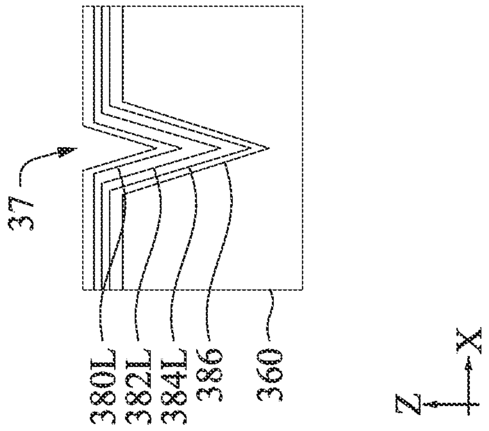
Figure 3A:
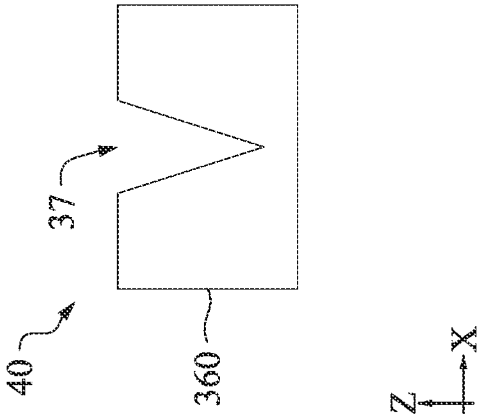
Figure 3F:
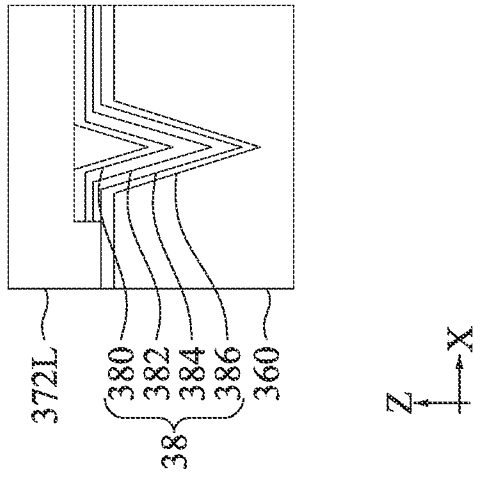
Figure 3E:
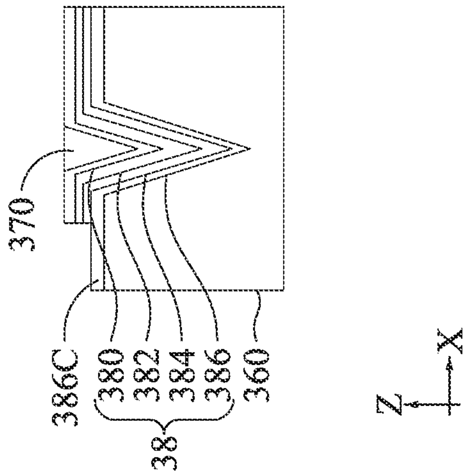
Figure 3D:
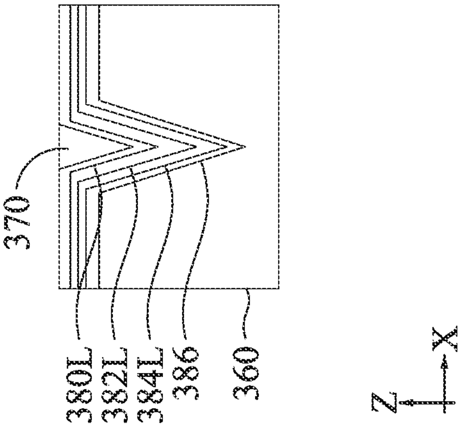
Figure 3H:
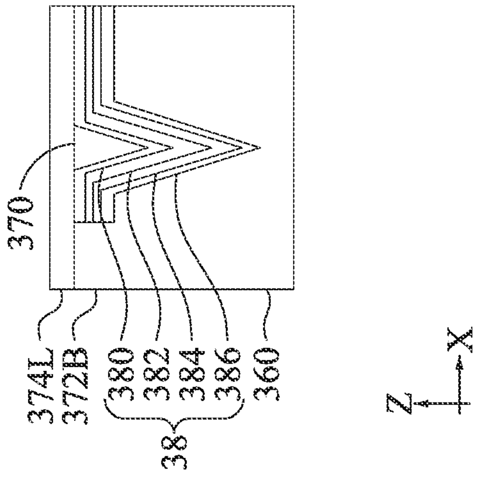
Figure 3G:
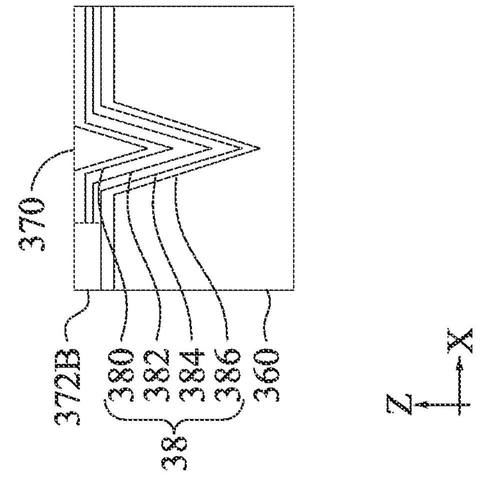
Figure 3K:
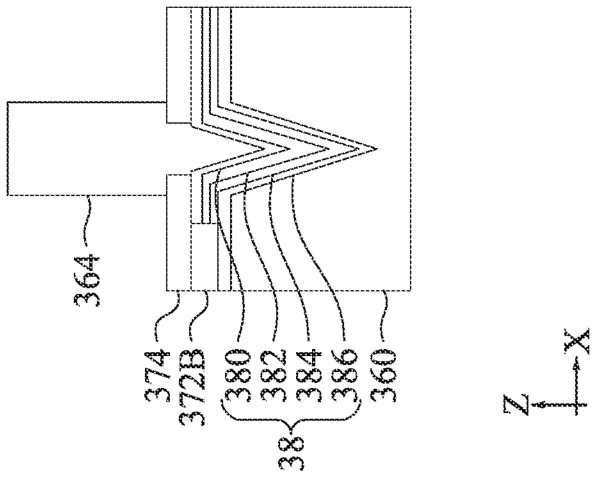
Figure 3J:
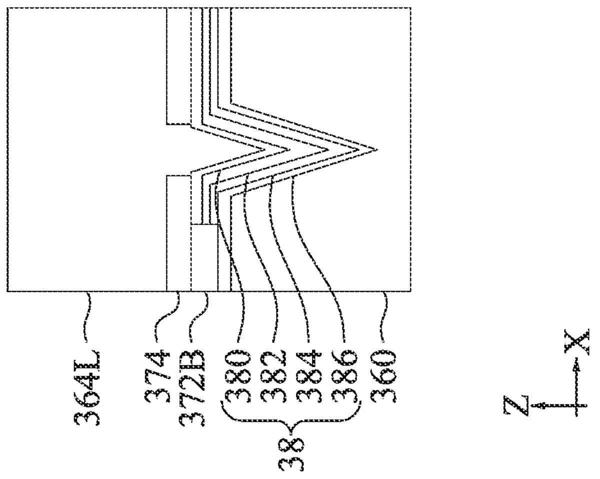
Figure 3I:
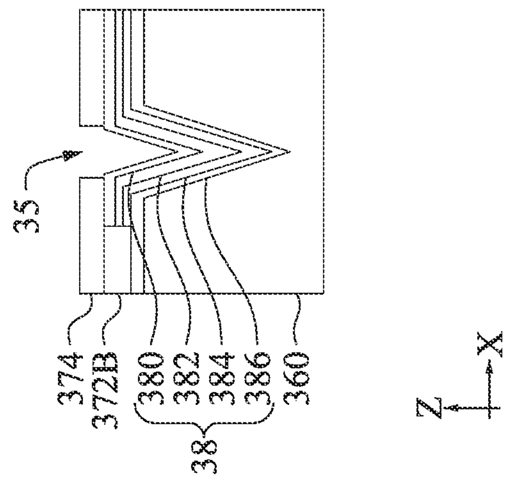
Figure 3N:
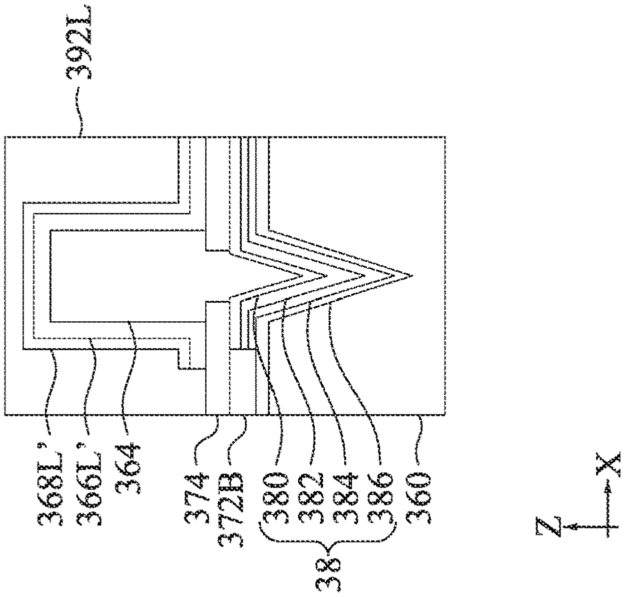
Figure 3M:
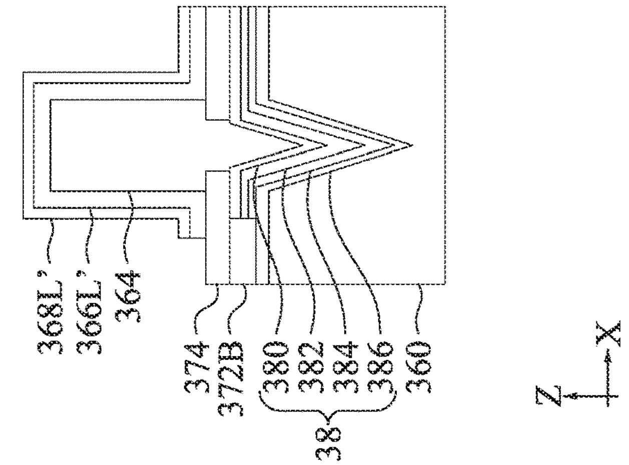
Figure 3L:
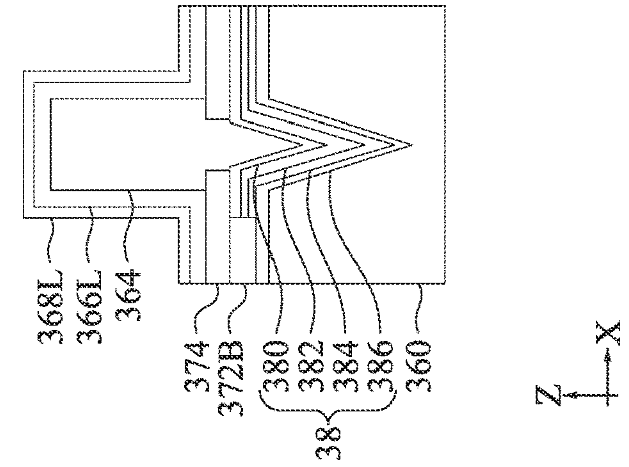
Figure 3Q:
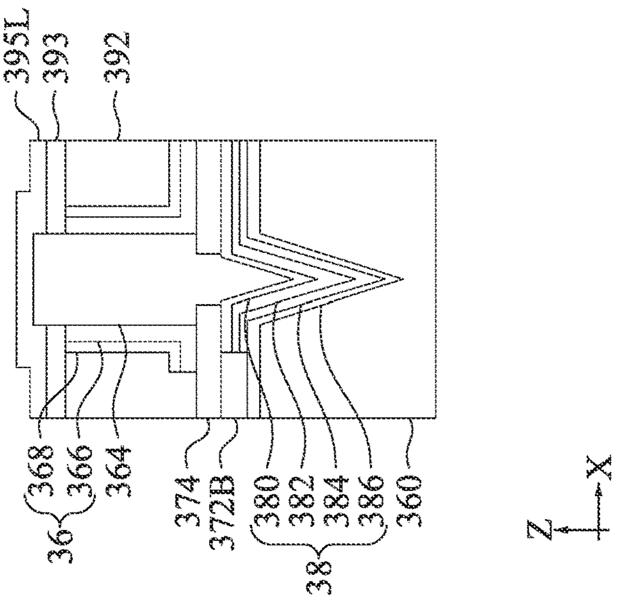
Figure 3P:
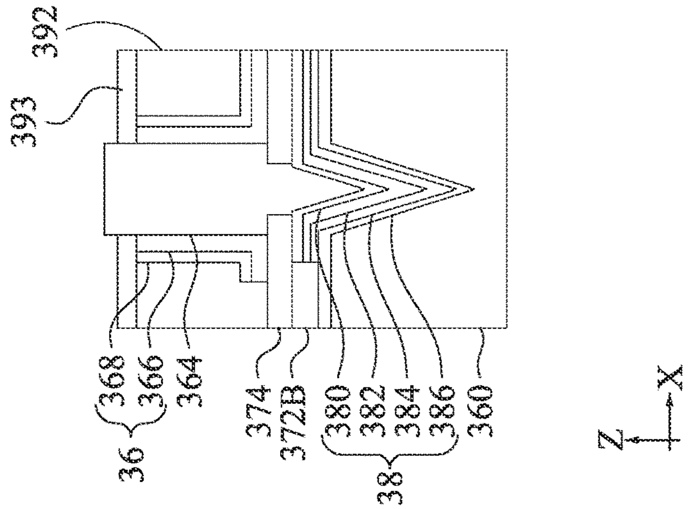
Figure 3O:
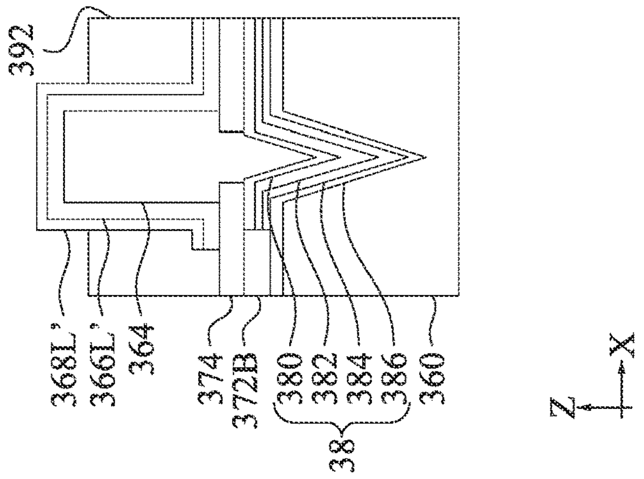
Figure 3S:
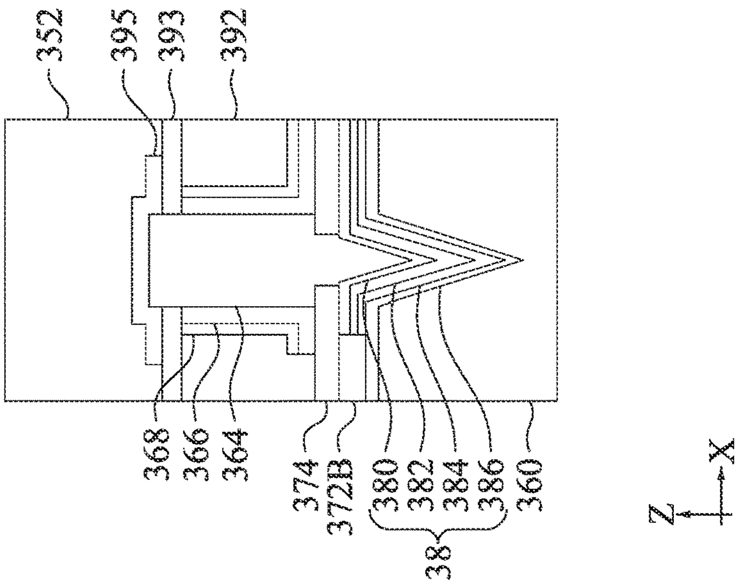
Figure 3R:
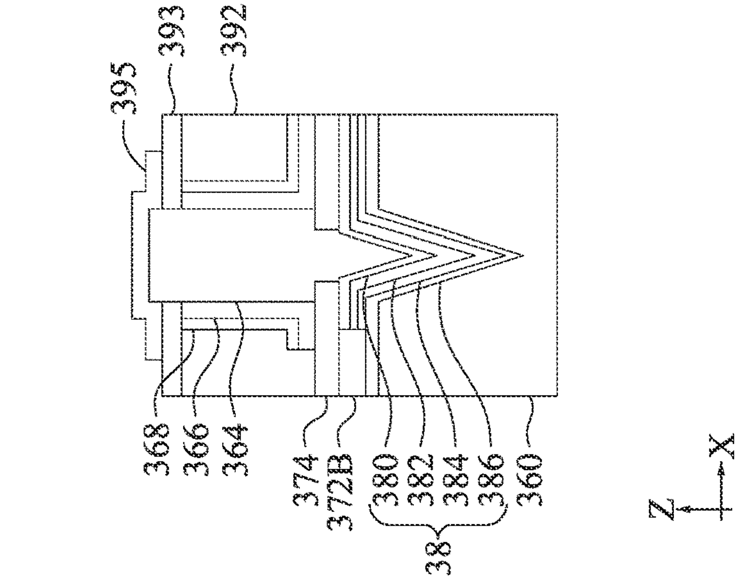
Figure 3U:
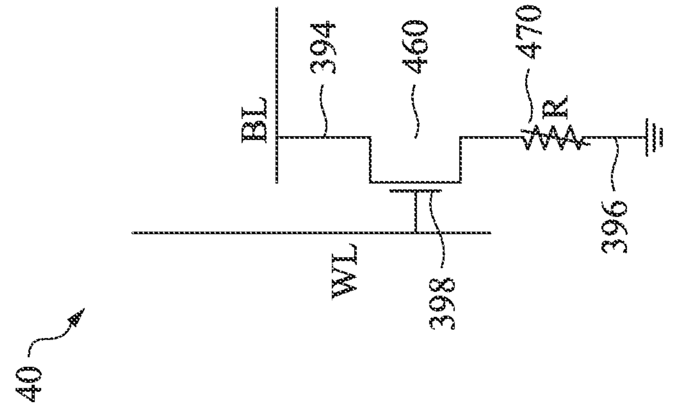
Figure 3T:
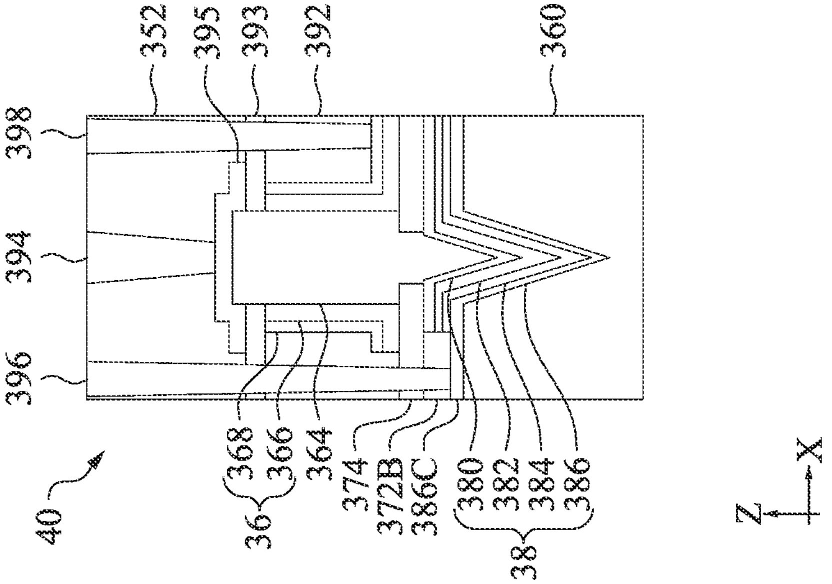
Figure 4B:
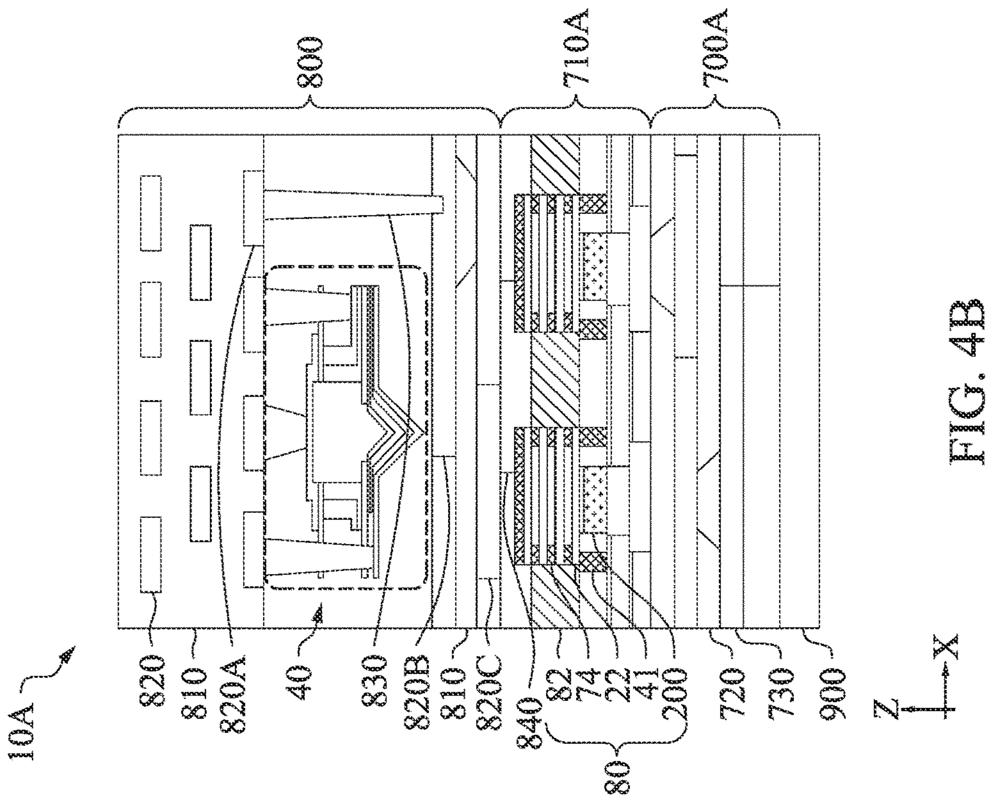
FIGS. 4A and 4B are diagrammatic cross-sectional and circuit diagram views of various embodiments of an IC device according to aspects of the present disclosure.
Figure 4A:
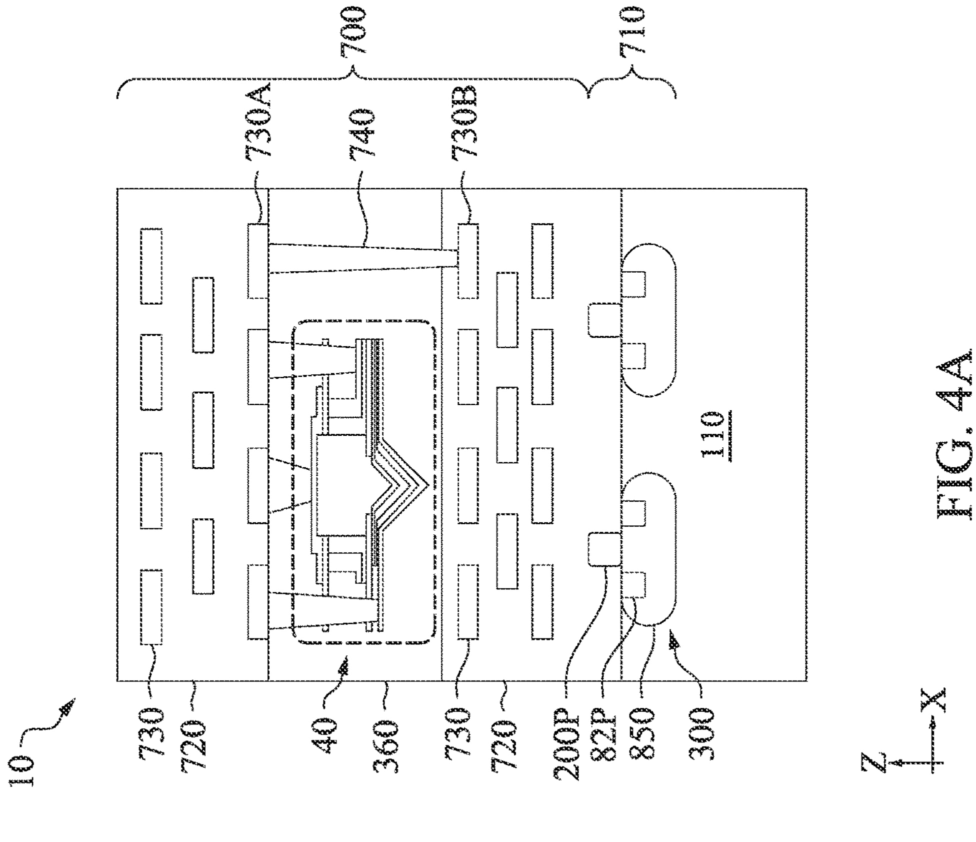
Figure 6:

FIGS. 3A-3T are views of various embodiments of an PCRAM device 40 of at various stages of fabrication according to aspects of the present disclosure. FIG. 3U is a circuit schematic diagram of the PCRAM device 40. FIGS. 4A and 4B are diagrammatic cross-sectional views of various embodiments of IC devices 10, 10A according to aspects of the present disclosure. FIG. 6 is a flowchart of a method 2000 of forming an IC device in accordance with various embodiments.

FIG. 6 illustrates a flowchart of method 2000 for forming an IC device or a portion thereof from a workpiece, according to one or more aspects of the present disclosure. Method 2000 is merely an example and is not intended to limit the present disclosure to what is explicitly illustrated in method 2000. Additional acts can be provided before, during and after the method 2000 and some acts described can be replaced, eliminated, or moved around for additional embodiments of the method. Not all acts are described herein in detail for reasons of simplicity. Method 2000 is described below in conjunction with fragmentary perspective and/or cross-sectional views of a workpiece, shown in FIGS. 3A-3T, at different stages of fabrication according to embodiments of method 2000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

In FIGS. 3A-3T, a fused device 38 is formed prior to forming a transistor of the PCRAM device 40. Some operations of the method 2000 are similar in many respects to those of method 1000 of FIG. 5, and reference to the related description will be provided.

In FIG. 3A, a first dielectric layer 360 is formed, which may be similar in most respects to the first dielectric layer 160 of FIG. 1A. Following formation of the first dielectric layer 360, an opening 37 may be formed in the first dielectric layer 360, in which the fused device 38 will be formed. Prior to forming the first dielectric layer 360, a device layer of the IC device 10 may be formed, as described with reference to FIGS. 1A, 2A and 2B above, corresponding to act 2010 of method 2000. Then, a first portion of an interconnect structure may be formed on the device layer, corresponding to act 2020 of method 2000. Namely, the PCRAM device 40 may be formed on a metal layer of an interconnect structure. The opening 37 my have inverted triangular cross-sectional profile in the XZ plane. In some embodiments, the opening 37 is conical or pyramidal in perspective view.

In FIGS. 3B-3E, following formation of the opening 37 in the first dielectric layer 360, the fused device 38 is formed on the first dielectric layer 360 including in the opening 37, corresponding to act 2030 of method 2000. The fused device 38 may be a phase change resistor, and may include one or more of the following layers: bottom electrode, PCM layer, heater layer, top electrode, passivation layer (optional), encapsulation (optional).

In FIG. 3B, material layers for forming the fused device 38 may be deposited in sequence as blanket conformal layers that inherit shape of the opening 37.

First, a top electrode 386 may be formed that includes a transition metal nitride, such as TiN, or another conductive material, such as W. The top electrode 386 may be formed by a suitable deposition operation, such as an ALD, CVD, or the like.

Following formation of the top electrode 386, a heater layer 384L may be formed. The heater layer 384L may be a layer of tungsten. The tungsten layer may be formed by a suitable deposition operation on the top electrode 386, such as by an ALD, CVD or the like.

Following formation of the heater 384L, a PCM layer 382L may be formed. The PCM layer 382L may be a phase change material layer, and may include any of the materials described above for the PCM layer 182L with reference to FIG. 1H. The PCM layer 382L may be formed by a suitable deposition operation, such as an ALD, CVD or the like.

Following formation of the PCM layer 382L, a bottom electrode layer 380L may be formed. The bottom electrode layer 380L may include a transition metal nitride, such as TiN, or another conductive material, such as W. The bottom electrode layer 380L may be formed by a suitable deposition operation, such as an ALD, CVD, or the like. In some embodiments, the bottom electrode layer 380L is the same material or substantially the same material as the top electrode 386.

In FIG. 3C, a mask layer 370 is formed on the layers 380L, 382L, 384L, 386, as shown. The mask layer 370 may be similar in most respects to the mask layer 170 of FIG. 1D.

In FIG. 3D, portions of the mask layer 370 above the opening 37 are removed by a suitable removal operation, such as a CMP. Following the CMP, the upper surface of the bottom electrode layer 380L outside the opening 37 is exposed.

In FIG. 3E, an electrode contact portion 386C of the top electrode 386 may be exposed by exposing a portion of the top electrode 386 via a suitable etch operation(s). For example, a patterned mask may be formed that covers the top electrode 386 and the mask layer 370 and has an opening corresponding to the electrode contact portion 386C. Exposed portions of the bottom electrode layer 380L, the PCM layer 382L and the heater layer 384L may be etched through the patterned mask as described with reference to FIG. 1I. Exposing the electrode contact portion 386C results in a bottom electrode 380, a PCM layer 382 and a heater layer 384 of the fused device 38 being formed as shown.

In FIG. 3F, following exposing the electrode contact portion 386C, a second dielectric layer 372L is formed on the electrode contact portion 386C, the bottom electrode 380 and the mask layer 370 in the opening 37. The second dielectric layer 372L may be similar in most respects to the first dielectric layer 160 described with reference to FIG. 1A.

In FIG. 3G, following formation of the second dielectric layer 372L, a suitable removal operation, such as a CMP, is performed to remove portions of the second dielectric layer 372L from above the bottom electrode 380, leaving a second dielectric layer 372B over the electrode contact portion 386C. Upper surfaces of the second dielectric layer 372B, the bottom electrode 380 and the mask layer 370 may be coplanar following the CMP.

In FIG. 3H, following planarization of the second dielectric layer 372B, the bottom electrode 380 and the mask layer 370, an insulating layer 374L may be formed on the planarized upper surface of the second dielectric layer 372B, the bottom electrode 380 and the mask layer 370. The insulating layer 374L is similar in most respects to the insulating layer 174 described with reference to FIG. 1G. The insulating layer 374L provides electrical and physical isolation between the fused device 38 and a gate electrode layer 368 formed in a later operation.

In FIGS. 3I-3K, an oxide semiconductor channel 364 is formed on the fused device 38, corresponding to act 2040 of method 2000.

In FIG. 3I, an opening 35 is formed that extends through the insulating layer 374. The opening 35 is extended by removing the mask layer 370. In FIG. 3I, sidewalls of the insulating layer 374 and a corner region of the bottom electrode 380 are not substantially aligned in the vertical direction. For example, the sidewalls of the insulating layer 374 are set back somewhat from the corner region, such that at least a portion of an upper surface of the bottom electrode 380 is exposed by the opening 35. In some embodiments, the sidewalls of the insulating layer 374 are directly aligned with the corner region of the bottom electrode 380. Formation of the opening 35 may include a first etch that breaks through the insulating layer 374, followed by a second etch that removes the mask layer 370. The first etch may be an anisotropic etch, such as an RIE or ICP through a patterned mask. The second etch may be anisotropic or isotropic, such as an RIE, ICP, wet etch or other suitable etch that is selective to the material of the mask layer 370 without substantially attacking material of the insulating layer 374.

In FIG. 3J, following formation of the opening 35, an oxide semiconductor layer 364L is formed in the opening 35 and on the insulating layer 374. The oxide semiconductor layer 364L is similar in most respects to the oxide semiconductor layer 164L described with reference to FIG. 1A, and may be or include IGZO or another suitable oxide semiconductor.

In FIG. 3K, following formation of the oxide semiconductor layer 364L, the oxide semiconductor layer 364L is patterned, resulting in a channel 364, as shown. The channel 364 may include a lower portion that is below the upper surface of the insulating layer 374 and in contact with the fused device 38 and an upper portion that protrudes above the insulating layer 374. The upper portion may have width in the X-axis direction that exceeds width of the lower portion in the X-axis direction. For example, the upper portion may partially cover an upper surface of the insulating layer 374. The lower portion may inherit shape of the opening 35. The upper portion may have shape (e.g., cross-sectional profile in the XY plane) that is the same as or different than that of the lower portion. For example, the lower portion may have conical shape and the upper portion may have cylindrical shape.

In FIGS. 3L-3P, a gate structure 36 is formed adjacent the channel 364, corresponding to act 2050 of method 2000.

In FIG. 3L, a gate dielectric layer 366L and a gate conductive layer 368L are formed on the upper portion of the channel 364. Formation of the gate dielectric layer 366L and the gate conductive layer 368L is similar in most respects to formation of the gate dielectric layer 166L and the gate conductive layer 168L described with reference to FIG. 1C. The gate dielectric layer 366L may cover the upper surface and sidewalls of the channel 364 and the upper surface of the insulating layer 374. The gate conductive layer 368L covers the gate dielectric layer 366L.

In FIG. 3M, the gate conductive layer 368L and the gate dielectric layer 366L are patterned to remove portions thereof that overlap the electrode contact portion 386C of the top electrode 386. A gate conductive layer 368L' and gate dielectric layer 366L' are formed by removal of the portions that overlap the electrode contact portion 386C.

In FIG. 3N, a third dielectric layer 392L is formed to cover the gate conductive layer 368L' and the insulating layer 374. Formation of the third dielectric layer 392L is similar in most respects to formation of the oxide layer 160 described with reference to FIG. 1A.

In FIG. 3O, the third dielectric layer 392L is recessed to form a third dielectric layer 392 and to expose portions of the gate conductive layer 368L' and the gate dielectric layer 366L'. As shown, level up an upper surface of the third dielectric layer 392 may be below upper surfaces of the channel 364, the gate dielectric layer 366L' and the gate conductive layer 368L'. This is beneficial so that, following formation of a second insulating layer 393, at least a portion of the channel 364 may protrude above the second insulating layer 393 for forming an electrode layer 395L thereon.

In FIG. 3P, exposed portions of the gate conductive layer 368L' and the gate dielectric layer 366L' above the third dielectric layer 392 are removed to form the gate electrode layer 368 and the gate dielectric layer 366. Then, the second insulating layer 393 is formed. The second insulating layer 393 may be similar in most respects to the insulating layers 174, 374 described with reference to FIGS. 1G and 3H. The second insulating layer 393 may be deposited as a conformal layer that covers the channel 364 and the third dielectric layer 392. Then, portions of the second insulating layer 393 on the upper surface of the channel 364 may be removed, resulting in the structure depicted in FIG. 3P.

In FIG. 3Q, following formation of the second insulating layer 393, the electrode layer 395L may be formed on exposed surfaces of the channel 364 and the second insulating layer 393. The electrode layer 395L may be similar in most respects to the first electrode layer 162 described with reference to FIG. 1A.

In FIG. 3R, the electrode layer 395L is patterned to form an electrode layer 395, resulting in the structure shown. The electrode layer 395 is in contact with the upper surface of the channel 364 and may be in contact with a portion of sidewalls of the channel 364 that protrude above the second insulating layer 393. Horizontal portions of the electrode layer 395 are on the upper surface of the second insulating layer 393.

In FIGS. 3S and 3T, word line, bit line and ground contacts are formed that connect to the gate structure, a source/drain and the fused device of the PCRAM device, corresponding to act 2060 of method 2000. FIG. 3U is a circuit schematic diagram of the PCRAM device 40 in accordance with various embodiments.

In FIG. 3S, a fourth dielectric layer 352 is formed over the electrode layer 395 and the second insulating layer 393. The fourth dielectric layer 352 may be similar in most respects to the first dielectric layer 160 and the dielectric layer 500 described with reference to FIG. 1A and FIG. 1L, respectively.

In FIG. 3T, contacts 394, 396, 398 are formed. The contact 394 lands on the electrode layer 395, which may be a drain electrode of a transistor 460 including the channel 364. The contact 396 extends through the fourth dielectric layer 352, the second insulating layer 393, the third dielectric layer 392, the insulating layer 374 and the second dielectric layer 372B and lands on the electrode contact portion 386C of the top electrode 386 (e.g., a ground terminal of a phase change resistor 470). The contact 398 extends through the fourth dielectric layer 352, the second insulating layer 393 and the third dielectric layer 392 and lands on the gate electrode layer 368. The contacts 394, 396, 398 are similar in most respects to the contacts 194, 196, 198 described with reference to FIG. 1N.

FIGS. 4A and 4B are diagrammatic cross-sectional views depicting IC devices 10, 10A that include the PCRAM device 40. The IC devices 10, 10A are similar in most respects to the IC devices 10, 10A described with reference to FIGS. 2A, 2B. Instead of including the PCRAM device 20, the IC devices 10, 10A include the PCRAM device 40. The PCRAM device 40 may be positioned in the front side interconnect structure 700 or in the back side interconnect structure 800, or both.

Embodiments may provide advantages. The PCRAM devices 20, 40 have a ground resistor (or phase change resistor) stacked on a source/drain, which reduces area of the PCRAM device 20, 40, increasing device density.

In accordance with at least one embodiment, a device includes: a device layer; and an interconnect structure on the device layer, the interconnect structure including a phase change random access memory (PCRAM) device. The PCRAM device includes: an electrode layer above the device layer; an oxide semiconductor layer on the electrode layer; a gate structure that wraps around the oxide semiconductor layer; an insulating layer on the gate structure; and a phase change resistor. The phase change resistor includes: a bottom electrode on the oxide semiconductor layer; a phase change layer on the bottom electrode; and a top electrode on the phase change layer.

In accordance with at least one embodiment, a device includes: a device layer; and an interconnect structure on the device layer, the interconnect structure including a phase change random access memory (PCRAM) device. The PCRAM device includes a phase change resistor that includes: a top electrode above the device layer; a phase change layer on the top electrode; and a bottom electrode on the phase change layer. The PCRAM device includes: an oxide semiconductor layer on the bottom electrode; a first insulating layer on the phase change resistor; a gate structure on the first insulating layer, the gate structure wrapping around the oxide semiconductor layer; a second insulating layer on the gate structure; and an electrode layer on the oxide semiconductor layer above the second insulating layer.

In accordance with at least one embodiment, a method includes: forming a device layer on a substrate; forming a first portion of an interconnect structure on the device layer; and forming a phase change random access memory (PCRAM) device on the first portion. The forming a PCRAM device includes: forming an oxide semiconductor layer; forming a gate structure that wraps around the oxide semiconductor layer; and forming a phase change resistor, the phase change resistor and the oxide semiconductor layer being stacked in a vertical direction. The method includes forming a second portion of the interconnect structure on the PCRAM device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a device layer on a substrate;

forming a first portion of an interconnect structure on the device layer;

forming a phase change random access memory (PCRAM) device on the first portion, including:

forming an oxide semiconductor layer;

forming a gate structure that wraps around the oxide semiconductor layer; and forming a phase change resistor, the phase change resistor and the oxide semiconductor layer being stacked in a vertical direction; and forming a second portion of the interconnect structure on the PCRAM device.

2. The method of claim 1, wherein the forming a phase change resistor includes:

forming a bottom electrode on the oxide semiconductor layer;

forming a phase change layer on the bottom electrode; and forming a top electrode on the phase change layer.

3. The method of claim 2, wherein the forming a phase change resistor includes forming the bottom electrode, the phase change layer and the top electrode having a sharp-tipped profile in cross-sectional side view.

4. The method of claim 2, wherein the forming a phase change resistor includes forming the bottom electrode, the phase change layer and the top electrode having an M-shaped profile in cross-sectional side view.

5. The method of claim 1, wherein the forming a phase change resistor is after the forming an oxide semiconductor layer.

6. The method of claim 1, wherein the forming a first portion of an interconnect structure is forming the first portion of a back side interconnect structure, the method further including:

forming a front side interconnect structure prior to the forming the first portion of a back side interconnect structure.

7. A method, comprising:

forming an electrode layer on a dielectric layer;

forming an oxide semiconductor layer on the electrode layer, the oxide semiconductor layer including a channel having a pillar shape;

forming a gate dielectric layer that wraps around the channel;

forming a gate conductive layer on the gate dielectric layer;

forming an insulating layer on the gate conductive layer, the insulating layer exposing an upper portion of the channel; and forming a phase change resistor on the upper portion of the channel, the phase change resistor including a bottom electrode, a phase change layer, and a top electrode.

8. The method of claim 7, further comprising:

forming a heater layer between the phase change layer and the top electrode.

9. The method of claim 7, wherein the channel has an aspect ratio in a range of about 1.5 to about 20.

10. The method of claim 7, wherein the oxide semiconductor layer includes indium-gallium-zinc-oxide.

11. The method of claim 7, wherein the gate dielectric layer includes a high-k dielectric material.

12. The method of claim 7, wherein the bottom electrode includes titanium nitride.

13. The method of claim 7, wherein the forming a phase change resistor includes forming the bottom electrode, the phase change layer, and the top electrode having a sharp-tipped profile in cross-sectional side view.

14. A method, comprising:

forming an oxide semiconductor channel on an electrode layer;

forming a gate structure that wraps around the oxide semiconductor channel;

forming a fused device on the oxide semiconductor channel, the fused device including a bottom electrode in contact with the oxide semiconductor channel, a phase change material layer on the bottom electrode, and a top electrode on the phase change material layer; and forming contacts including a first contact landing on the electrode layer, a second contact landing on the top electrode, and a third contact landing on the gate structure.

15. The method of claim 14, wherein the forming contacts includes:

forming openings through a mask layer to expose the electrode layer, the top electrode, and the gate structure; and depositing conductive material in the openings.

16. The method of claim 14, further comprising forming spacers on sidewalls of the fused device prior to the forming contacts.

17. The method of claim 14, wherein the fused device is a metal-insulator- metal device.

18. The method of claim 14, wherein the phase change material layer includes germanium-antimony-tellurium.

19. The method of claim 14, wherein the forming a fused device includes forming the bottom electrode, the phase change material layer, and the top electrode as conformal layers.

20. The method of claim 14, wherein the forming a fused device includes forming the bottom electrode, the phase change material layer, and the top electrode having a sharp-tipped profile in cross-sectional side view.

* * * * *